US008050895B2

(12) United States Patent  
Takeuchi

(10) Patent No.: US 8,050,895 B2
(45) Date of Patent: Nov. 1, 2011

(54) VARIATION SIMULATION SYSTEM

(75) Inventor: Kiyoshi Takeuchi, Tokyo (JP)

(73) Assignee: NEC Corporation, Tokyo (JP)

(*) Notice: Subject to any disclaimer, the term of this patent is extended or adjusted under 35 U.S.C. 154(b) by 1070 days.

(21) Appl. No.: 11/659,972

(22) PCT Filed: Aug. 10, 2005

(86) PCT No.: PCT/JP2005/014668
§ 371 (c)(1),
(2), (4) Date: Feb. 12, 2007

(87) PCT Pub. No.: WO2006/016611
PCT Pub. Date: Feb. 6, 2006

(65) Prior Publication Data
US 2007/0198235 A1    Aug. 23, 2007

(30) Foreign Application Priority Data
Aug. 13, 2004 (JP) .................. 2004-235831
Jun. 23, 2005 (JP) .................. 2005-183904

(51) Int. Cl.
G06F 17/10 (2006.01)
(52) U.S. Cl. ............................... 703/2; 703/13
(58) Field of Classification Search .......... 703/2, 13–16; 716/4
See application file for complete search history.

(56) References Cited

U.S. PATENT DOCUMENTS

| 5,655,110 A * | 8/1997 | Krivokapic et al. ........... 716/19 |
| 6,728,937 B2 | 4/2004 | Wakita et al. |
| 6,735,558 B1 | 5/2004 | Yamaguchi |
| 7,136,787 B2 * | 11/2006 | Schlessinger et al. ........... 703/2 |
| 2005/0288918 A1 * | 12/2005 | Chen et al. ................ 703/22 |

FOREIGN PATENT DOCUMENTS

| JP | 2001-35930 | 2/2001 |
| JP | 2001-188816 | 7/2001 |

OTHER PUBLICATIONS

B. J. Cheng, et al., "Integrating 'atomistic', intrinsic parameter fluctuations into compact model circuit analysis", 33 rd Conference on European Solid-State Device Research (ESSDERC 2003), Extended Abstracts, Sep. 16, 2003, pp. 437-440.
Carroll J., et al., "FET Statistical Modeling Using Parameter Orthogonalization", IEEE Transactions on Microwave Theory and Techniques, 1996.01, vol. 44, No. 1, pp. 47-55.
Form PCT/IB/326.
Form PCT/IB/338.
Form PCT/IB/373 dated Sep. 25, 2007.
Form PCT/IB/373 dated Nov. 19, 2007.
Form PCT/ISA/237 with English-Language translation.

* cited by examiner

*Primary Examiner* — Kamini S Shah
*Assistant Examiner* — Herng-Der Day
(74) *Attorney, Agent, or Firm* — McGinn IP Law Group, PLLC

(57) ABSTRACT

A variation simulation system providing for facilitated circuit design with suppressed deterioration in performance otherwise caused by variations. A variation analysis unit 100 extracts statistical features of variations from a large number of samples beforehand. A model analysis unit 200 checks response of a circuit simulation output to parameter variations. A fitting execution unit 300 collates the information, obtained in this manner, to each other to determine the manner of variations of the parameters which will reproduce statistical features of the device samples.

16 Claims, 17 Drawing Sheets

VARIATION SIMULATION SYSTEM

TECHNICAL FIELD

This invention relates to a variation simulation system, a variation simulation method and a variation simulation program. More particularly, this invention relates to a variation simulation system, a variation simulation method and a variation simulation program, which may be suited to efficiently simulating variations in characteristics in electronic circuits.

BACKGROUND ART

Circuit simulation has a wide spread use in the design of circuits employing electronic devices, such as CMOS circuits. In a circuit simulation, characteristics of electronic devices, such as current-voltage characteristics, capacitance-voltage characteristics or the like, are described by equation (model equation, usually composed of plural equations). These equations include a set of constants, termed parameters, which may be modified. For carrying out the circuit simulation, it becomes necessary, first of all, to determine the values of these parameters so that the model equations will substantially accurately reproduce actual device characteristics. This operation is termed 'parameter extraction', and a set of so determined parameters, or a model of a specified device, corresponding to the set of parameters, is referred to as a 'device model' or simply as a 'model'. Meanwhile, the manner of representation of a device characteristic, specified by the model equations, is referred to as 'model basis' in distinction from the model of a specific device.

In electronic device characteristics, there are variations (or uncertainty) in characteristics ascribable to variations in fabrication. It is therefore necessary in circuit design that the circuit be made to operate as normally even if device characteristics are varied to a more or less extent.

In order to meet this requirement, it is customary, especially in large scale logic circuits, to deal with device variations as follows:

That is, a 'corner-model', having characteristics deviated to the maximum possible extent, is provided in addition to a typical device model. For example, it is supposed that there is a device having a driving capability varied to the highest value, that is, a device which, if used, would speed up the operation, and another device having a driving capability varied to the lowest value, that is, a device which, if used, would slow down the operation, and hence device models (high speed model and low speed model) are prepared for the respective devices.

By designing a circuit with allowance (margin) so that the circuit operates with use of any of these models, a circuit may be implemented which will operate stably despite variations in device characteristics.

The above-described method, employing a corner model, is a simple method capable of coping with variations rather easily. However, the following technique, which might allow more precise analysis of the effect the variations might have on a circuit has been disclosed in Patent Document 1 and in Non-Patent Document 1.

Initially, N devices having different characteristics due to variations, are provided, and measurements are made of these characteristics.

In Patent Document 1 and in Non-Patent Document 1, N devices are generated by device simulation which takes the variation phenomenon into account. Measurement is simulated by a computer.

The parameter extraction is then carried out for each of the devices to generate N device models.

Finally, circuit simulation is carried out, using each of the N models, in order to check how circuit characteristics are varied.

Among off-the-shelf circuit simulation programs, there are those in which a Monte Carlo function is added for taking variations into account. This is the function in which circuit characteristics are computed automatically and repeatedly as parameters contained in a device model are varied at random with a certain probability distribution.

If this function is used, it is possible, for example, to automatically carry out evaluation on how much the delay time in a circuit is varied in case the gate length of a MOS transistor, as one of its parameters, is varied with the standard deviation of ±10%.

[Patent Document 1]

Japanese Patent Kokai Publication No. JP-P2001-188816A

[Non-Patent Document 1]

B. J. Cheng et al., "Integrating 'atomistic', intrinsic parameter variations into compact model circuit analysis", 33rd Conference on European Solid-State Device Research (ESS-DERC 2003), Extended Abstracts, Sep. 16, 2003, pp.437-440

DISCLOSURE OF THE INVENTION

Problems to be Solved by the Invention

The above-described conventional technique has the following problems.

The first problem is that, with increase in variations, the circuit performance is deteriorated. The reason may be stated as follows:

If the device is miniaturized, the variations tend to be increased, as a result of which it becomes necessary to provide a larger margin for the variations in circuit design, thus lowering the circuit performance. For example, with the technique employing the conventional corner model, the circuit is designed with margin so that it will operate even with the slow corner model. Hence, the circuit performance is limited by the slow corner model, such that increase in the variations is directly reflected in the deteriorated circuit performance.

The second problem is that the technique is inefficient in accurately evaluating the effect the variations might have on the circuit. The reason may be stated as follows:

If circuit design based on accurate variation evaluation is carried out, it is possible to suppress deterioration in the circuit performance ascribable to the variations. However, with the conventional technique, it is necessary to carry out a large number of (N as described above, such as 100 to 1000) times of the parameter extracting operations, in preparation for circuit simulation. The parameter extraction involves repetitions of trial-and-error operations which would be a burden if such operations are carried out a large number of times.

The third problem is that the guideline in determining which parameters in the circuit simulation exploiting the Monte Carlo method are to be varied with which probability distribution in executing the circuit simulation is not clear. The reason may be stated as follows:

Among the marketed circuit simulation programs, there are those allowing for use of the Monte Carlo function. However, it is left entirely to a user which parameters should be varied with which probability distribution. Therefore, it is not clear how simulation correctly reproducing actual variations can be implemented.

Accordingly, it is an object of the present invention to provide a system, a method and a program for variation simulation assuring facilitated circuit design suppressing performance deterioration ascribable to variations.

It is another object of the present invention to provide a system for simulation of variation assuring efficient execution of circuit simulation which reflects variations.

It is yet another object of the present invention to provide a system for simulation of variation for implementing circuit simulation which correctly reproduces actual variations.

Means to Solve the Problems

For accomplishing the above objects, the present invention may be summarized substantially as follows:

A system in one aspect of the present invention includes a variation analysis unit that extracts a statistical property of a characteristic value which reflects a physical phenomenon, a model analysis unit that analyzes the response of the characteristic value simulated by a model which simulates the physical phenomenon to a cause parameter, and a fitting execution unit that determines the manner of variations of the cause parameter, based on the result of analysis of the response, so that the statistical property will be reproduced by the model.

The system according to the present invention may also include a simulation execution unit that executes simulation based on the manner of the variations of the cause parameter determined by the fitting execution unit.

According to the present invention, the variation analysis unit extracts a statistical property of a characteristic value which reflects a physical phenomenon, using principal component analysis.

According to the present invention, the variation analysis unit extracts a statistical property of a characteristic value which reflects a physical phenomenon, using principal component analysis. The model analysis unit determines the response of the characteristic value when the cause parameter is displaced a preset width, and the fitting execution unit compares the result of specific value analysis of a response matrix obtained by weighting the response with the result of the principal component analysis to decide coincidence/non-coincidence.

A system in another aspect of the present invention includes a characteristic acquisition unit that acquires a characteristic value which reflects a physical phenomenon, a statistical analysis unit that extracts statistical features of the characteristic value by principal component analysis, a model acquisition unit that acquires a model which simulates the physical phenomenon, a response measurement unit that measures the response of the characteristic value simulated when a cause parameter is displaced a preset width, a response weighting unit that weights the response to obtain a response matrix, a response measurement unit that performs singular value decomposition of the response matrix, and a coincidence comparator that compares the result of the principal component analysis with the result of the singular value decomposition to decide coincidence/non-coincidence.

The system of the present invention may further include a simulation execution unit that executes simulation based on the information on weighting which brings about the coincidence.

According to the present invention, the characteristic value which reflects the physical phenomenon is a transformed characteristic value obtained by applying preset transformation to an initial characteristic value. The characteristic value simulated by the model is a characteristic value transformed by applying the same transformation as the transformation to an initial simulated characteristic value.

According to the present invention, a parameter contained in the model simulating the physical phenomenon and the cause parameter which is the preset parameter are correlated with each other by a preset mathematical equation.

According to the present invention, the manner of variations of the cause parameter is prescribed by the standard deviation or variance of each cause parameter.

According to the present invention, the characteristic value which reflects the physical phenomenon includes a characteristic value of an electronic device, an optical device or a mechanical device under a preset measurement condition.

According to the present invention, the characteristic value which reflects the physical phenomenon includes a current value, a voltage value, a capacitance value, an inductance value, a resistance value, a complex voltage value, a complex current value or a value derived therefrom.

According to the present invention, the characteristic value which reflects the physical phenomenon is obtained by device simulation which takes account of a variation phenomenon.

The system according to the present invention executes simulation, using a model which simulates a physical phenomenon, the information on the manner of variation of the cause parameter, and the information correlating a parameter contained in the model which simulates a physical phenomenon and the cause parameter.

A system according to the present invention at least includes a model acquisition unit that acquires the information on a manner of variation of a cause parameter, a calculation execution unit that executing simulation using a model simulating a physical phenomenon, the information on the manner of variation of the cause parameter, and a mathematical equation correlating a parameter included in the model simulating the physical phenomenon with the cause parameter, and a result output unit that outputs the result of execution.

A system according to the present invention executes circuit simulation using a model which simulates device characteristics, the information on a manner of variation of a cause parameter, and a mathematical equation correlating a parameter contained in the model simulating the device characteristics with the cause parameter.

A system according to the present invention at least includes a model acquisition unit that acquires the information on a manner of variation of a cause parameter, a calculation execution section that executes circuit simulation using a model which simulates device characteristics, the information on the manner of variation of the cause parameter, and a mathematical equation correlating a parameter contained in the model simulating the device characteristics with the cause parameter, and a result output unit that outputs the result of execution.

(A1) A system according to the present invention includes a variation analysis unit that extracts a statistical property of a characteristic value which reflects a physical phenomenon, a model analysis unit that analyzes the response of the characteristic value simulated by a model which simulates the physical phenomenon to a preset parameter, and a fitting execution unit that determines a manner of variation of the preset parameter, based on the result of analysis of the response, so that the statistical property will be reproduced by the model.

(A2) A system according to the present invention includes a characteristic acquisition unit that acquires a characteristic value which reflects a physical phenomenon, a statistical analysis unit that extracts statistical features of the characteristic value by principal component analysis, and a model acquisition unit that acquires a model which simulates the physical phenomenon. The system also includes a response measurement unit that measures the response of the characteristic value simulated when a preset parameter is displaced a preset width, and a response weighting unit that weights the response to obtain a response matrix. The system also includes a response analysis unit that performs singular value decomposition of the response matrix, and a coincidence comparator that compares the result of the principal component analysis with the result of the singular value decomposition to decide coincidence/non-coincidence.

(A3) A system according to the present invention includes a characteristic acquisition unit that acquires a characteristic value which reflects a physical phenomenon, a statistical analysis unit that extracts statistical features of the characteristic value by principal component analysis, and a response acquisition unit that acquires the response of a simulated characteristic value for a preset parameter. The system also includes a response weighting unit that weights the response to acquire a response matrix, a response analysis unit that performs singular value decomposition of the response matrix, and a coincidence comparator that compares the result of the principal component analysis with the result of the singular value decomposition to decide coincidence/non-coincidence.

(A4) According to the present invention, the preset parameter is the cause parameter or the parameter contained in the model which simulates the physical phenomenon.

(A5) According to the present invention, the preset equation which correlates the parameter contained in the model simulating the physical phenomenon and the cause parameter may be a linear transformation equation.

A first method for determining a variation model using a computer system according to the present invention includes: a first step of extracting a statistical property of a characteristic value which reflects a physical phenomenon, a second step of analyzing the response of a characteristic value simulated by a model which simulates the physical phenomenon to a cause parameter, and a third step of determining a manner of variation of a cause parameter, based on the result of response analysis, so that the statistical property will be reproduced by the model.

A first program according to the present invention includes a program that causes a computer to execute a first processing for extracting a statistical property of a characteristic value reflecting a physical phenomenon, and a second processing for analyzing the response of a characteristic value simulated by a model which simulates the physical phenomenon to a cause parameter. The first program according to the present invention also includes a third processing for determining the manner of variation of the cause parameter, based on the result of analysis of the response, so that the statistical property will be reproduced by the model. The program according to the present invention may allow the computer to execute a fourth processing of executing the simulation based on the manner of variation of the cause parameter determined as described above.

(A10) A second method (or program) for determining a second variation model program according to the present invention includes:

a step (processing) for acquiring a characteristic value reflecting a physical phenomenon;

a step (processing) for extracting a statistical feature of the characteristic value by principal component analysis;

a step (processing) for acquiring a model simulating the physical phenomenon;

a step (processing) for measuring the response of a characteristic value simulated when a cause parameter is displaced a preset width;

a step (processing) for weighting the response to acquire a response matrix;

a step (processing) for performing singular value decomposition of the response matrix, and a processing for comparing the result of the principal component analysis with the result of the singular value decomposition to decide coincidence/non-coincidence. A program for determining a second variation model program according to the present invention causes a computer to execute the processing corresponding to the above steps.

(A11) In the method (or program) for determining a first or a second variation model, according to the present invention, the characteristic value which reflects the physical phenomenon is a characteristic value obtained by performing preset transformation on an initial characteristic value, and the characteristic value simulated on the model is the characteristic value obtained by performing the transformation, which is the same as the aforementioned transformation, on the initial simulated characteristic value.

(A12) In the method (or program) for determining a variation model, according to the present invention, the parameter contained in the model simulating the physical phenomenon and the aforementioned preset parameter are correlated by a preset mathematical equation.

(A13) In the method (or program) for determining a variation model, according to the present invention, the manner of variations of each preset parameter is prescribed by the standard deviation or variance of each preset parameter.

(A14) In the method (or program) for determining a variation model, according to the present invention, the characteristic value which reflects the physical phenomenon includes characteristic values of an electronic device, an optical device or a mechanical device under preset measurement conditions.

(A15) In the method (or program) for determining a variation model, according to the present invention, the characteristic value which reflects the physical phenomenon includes a current value, a voltage value, a capacitance value, an inductance value, a resistance value, a complex voltage value, a complex current value or a value derived therefrom.

(A16) In the method (or program) for determining a variation model, according to the present invention, the characteristic value which reflects the physical phenomenon is obtained by device simulation which takes account of a variation phenomenon.

(A17) A first method for variation simulation according to the present invention includes, in executing variation simulation on a computer, a step of extracting a statistical property of a characteristic value reflecting the physical phenomenon;

a step of analyzing the response of a characteristic value simulated by a model which simulates the physical phenomenon to a preset parameter;

a step of determining the manner of variation of the preset parameter, based on the result of analysis the response, so that the statistical property will be reproduced on the model; and a step of executing simulation based on the manner of variation of the preset parameter, determined as described above. A first program for variation simulation according to the present invention causes a computer to execute the processing corresponding to each step.

(A19) The first method (or program) for variation simulation, according to the present invention, includes the step of extracting the statistical property of the characteristic value, reflecting the physical phenomenon, using the principal component analysis. The first program for variation simulation, according to the present invention, causes a computer to execute the processing of the above step.

(A20) A first method (or program) for variation simulation according to the present invention includes:
a step of extracting a statistical feature of the characteristic value, which reflects a physical phenomenon, by principal component analysis,
a step of acquiring a model simulating the physical phenomenon;
step of measuring the response of a characteristic value simulated when a preset parameter is displaced a preset width, and
a step of comparing the result of singular value decomposition on a response matrix obtained by weighting the response and the result of the principal component analysis to decide coincidence/non-coincidence. A first program for variation simulation according to the present invention causes a computer to execute the processing corresponding to each step.

(A21) A second method (or program) for variation simulation according to the present invention includes:
a step of acquiring a characteristic value reflecting a physical phenomenon;
a step of extracting a statistical feature of the characteristic value by principal component analysis;
a step of acquiring a response of a simulated characteristic value to a preset parameter;
a step of weighting the response to obtain a response matrix, a step of performing singular value decomposition of the response matrix; and
a step of comparing the result of the principal component analysis with the result of the singular value decomposition to decide coincidence/non-coincidence. A second program for variation simulation according to the present invention causes a computer to execute the processing corresponding to each step.

(A22) In the second method (or program) for variation simulation, according to the present invention, the characteristic value which reflects the physical phenomenon is a converted characteristic value obtained by applying preset transformation to an initial characteristic value. The characteristic value simulated by the model is a characteristic value transformed by applying the same transformation as the transformation to an initial simulated characteristic value.

(A23) In the second method (or program) for variation simulation, according to the present invention, a parameter contained in the model simulating the physical phenomenon and the cause parameter which is the preset parameter are correlated with each other by a preset mathematical equation.

(A24) In the second method (or program) for variation simulation, according to the present invention, the manner of variations of the cause parameter is prescribed by the standard deviation or variance of each cause parameter.

(A25) In the second method (or program) for variation simulation, according to the present invention, the characteristic value which reflects the physical phenomenon includes a characteristic value of an electronic device, an optical device or a mechanical device under a preset measurement condition.

(A26) In the second method (or program) for variation simulation, according to the present invention, the characteristic value which reflects the physical phenomenon includes a current value, a voltage value, a capacitance value, an inductance value, a resistance value, a complex voltage value, a complex current value or a value derived therefrom.

(A27) In the second method (or program) for variation simulation, according to the present invention, the characteristic value which reflects the physical phenomenon is obtained by device simulation which takes account of a variation phenomenon.

(A28) In the above method, according to the present invention, the preset parameter is a cause parameter or a parameter contained in the model which simulates the physical phenomenon.

(A29) A third method (or program) for variation simulation according to the present invention includes, in executing variation simulation on a computer system,
a step of executing the simulation, using a model which simulates a physical phenomenon, the information on a manner of variation of a cause parameter, and the information on a mathematical equation which correlates a parameter contained in the model simulating the physical phenomenon and the cause parameter. A third program for variation simulation according to the present invention causes a computer to execute the processing corresponding to the above step.

(A30) A fourth method (or program) for variation simulation according to the present invention includes, in executing variation simulation on a computer system, at least
a step of acquiring the information on a manner of variation of a cause parameter;
a step of executing the simulation, using a model simulating a physical phenomenon, the information on the manner of variation of the cause parameter, and the information on a mathematical information correlating a parameter contained in the model simulating the physical phenomenon and the cause parameter; and
a step of outputting the execution result. A fourth program for variation simulation according to the present invention permits a computer to execute the processing corresponding to the above step.

(A31) A fifth method (or program) for variation simulation according to the present invention includes, in executing variation simulation on a computer system,
a step of executing circuit simulation, using a model simulating device characteristics, the information on the manner of variation of the cause parameter, and the information on a mathematical equation correlating a parameter contained in the model simulating device characteristics and the cause parameter. A fifth program for variation simulation according to the present invention causes a computer to execute the processing corresponding to the above step.

(A32) A sixth method (or program) for variation simulation according to the present invention includes, in executing variation simulation on a computer system, at least:
a step of acquiring the information on a manner of variation of a cause parameter;
a step of executing simulation using a model simulating device characteristics, the information on the manner of variation of the cause parameter, and the information on a mathematical equation correlating a parameter contained in the model simulating the device characteristics with the cause parameter; and
a step of outputting the execution result to an output device. A sixth program for variation simulation according to the present invention causes a computer to execute the processing corresponding to the above step.

(A33) In the variation model determining method (or program), or the variation simulation method (or program), according to the present invention, the cause parameter is such a parameter the variations of which represent the cause of variations of the characteristic value. The manner of variations of the parameter constituting the model caused by variations of the cause parameter is defined by a preset mathematical equation.

(A34) In the variation model determining method, or the variation simulation method, according to the present invention, the mathematical equation correlating the parameter contained in the model simulating the device characteristics with the cause parameter may optionally be set.

(A35) In the variation simulation method (or program), according to the present invention, the mathematical equation correlating the parameter contained in the model simulating the device characteristics with the cause parameter may optionally be set.

(A36) In the variation model determining method (or program), or the variation simulation method or program, according to the present invention, the manner of representation of device characteristics as prescribed by a model equation is selectable.

(A37) In the variation model determining method (or program), or the variation simulation method (or program), according to the present invention, the manner of representation of the physical phenomenon as prescribed by a model equation is selectable.

(A38) In the variation simulation system (method or program), according to the present invention, the characteristic value simulated by the model and a parameter contained in the model simulating the physical phenomenon are correlated with each other by a preset mathematical equation (characteristic value of a model=f(parameter of a model) ), while a parameter contained in a model and a cause parameter are correlated with each other by a preset function (parameter of the model=g(cause parameter) ), in order to carry out analysis of a response of the characteristic value to the cause parameter.

(A39) In the variation simulation system (method or program), according to the present invention, the characteristic value simulated by the model and a parameter contained in the model simulating the physical phenomenon are correlated by a preset mathematical equation (characteristic value of a model=f(parameter of a model)), and at least a trial value of a coefficient of linear or non-linear transformation equation which correlates the parameter simulating the physical phenomenon and the cause parameter (a parameter of the model=g(cause parameter)) is changed to execute the fitting.

MERITORIOUS EFFECT OF THE INVENTION

According to the present invention, extraction of a variation model and variation simulation based thereon may be improved in efficiency. The reason is that it is sufficient in the present invention to carry out a parameter fitting operation employing a search algorithm only once, and that, if once a variation model is determined, the circuit simulation for a circuit suffering from variations may flexibly be carried out using the so determined variation model.

According to the present invention, the circuit simulation may be achieved in which actual variations are reproduced correctly. The reason is that, since the extraction of the variation model may be improved in efficiency, a large number of times of trial operations may be carried out in connection with selection of a method for setting a variation model suited for correctly reproducing the actual variations, such as the information on cause parameters as later described. In addition, variation reproduction suited to the object in view becomes possible by transformation of characteristics.

Moreover, physically correct variation reproduction becomes possible due to use of the cause parameter.

According to the present invention, the circuit design with suppressed performance deterioration ascribable to variations becomes possible. The reason is that, by determining the variation model according to the present invention, the circuit simulation may efficiently be carried out as variations are correctly taken into account.

Figure 1:
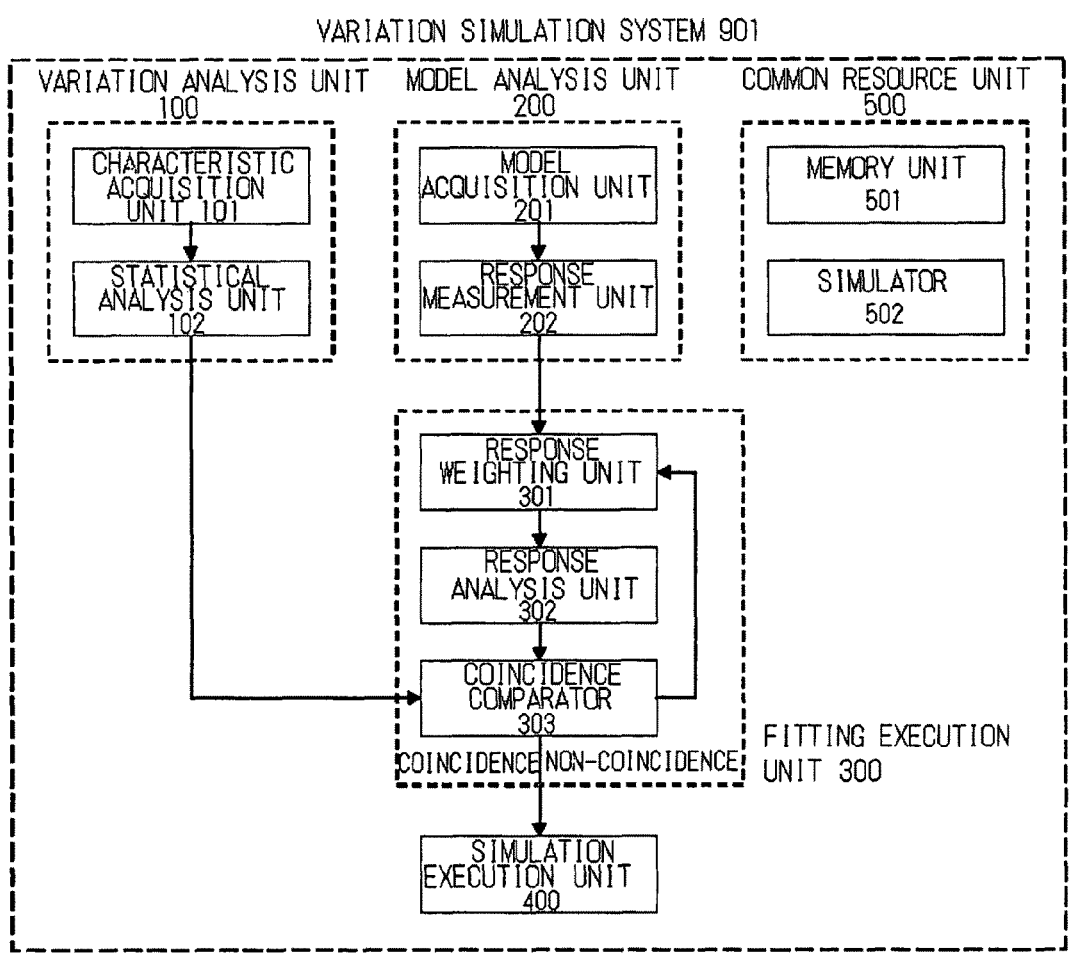
FIG. 1 is a block diagram showing the constitution of a first embodiment of the present invention.

EXPLANATIONS OF SYMBOLS 100 variation analysis unit
101 characteristic acquisition unit
102 statistical analysis unit
200 model analysis unit
201 model acquisition unit
202 response measurement unit
210 response acquisition unit
300 fitting execution unit
301 response weighting unit
302 response analysis unit
303 coincidence comparator
304 result output unit
400 simulation execution unit
401 model acquisition unit
402 computation execution unit
403 result output unit
500 common resource unit
501 memory unit
502 simulator
901, 901B variation simulation system
902, 902B variation simulation extraction sub-system
903 variation simulation execution sub-system

MOST PREFERRED MODE FOR CARRYING OUT THE INVENTION

Referring to the drawings, preferred embodiments of the present invention will be described in detail.

Referring first to FIG. 1, a variation simulation system 901 according to a first embodiment of the present invention includes a variation analysis unit 100, a model analysis unit 200, a fitting execution unit 300, a simulation execution unit 400 and a common resource unit 500.

The variation analysis unit 100 includes a characteristic acquisition unit 101 and a statistical analysis unit 102.

The model analysis unit 200 includes a model acquisition unit 201 and a response measurement unit 202.

The fitting execution unit 300 includes a response weighting unit 301, a response analysis unit 302 and a coincidence comparator 303.

The common resource unit 500 includes a memory unit 501 and a simulator 502.

The above component parts operate substantially as follows:

The variation analysis unit 100 performs statistical analysis of variations in characteristics of a plural number of target devices.

The model analysis unit 200 analyzes a model for simulation, simulating a target device, as to what is the response of the characteristics of the model against parameter change.

The fitting execution unit 300 collates the results obtained by the variation analysis unit 100 and those obtained by the model analysis unit 200 to decide on how the parameters are to be varied in order for the variations of the target devices to be reproduced by the model.

The simulation execution unit 400 carries out the simulation based on the result determined by the fitting execution unit 300.

The common resource unit 500 provides resources needed for carrying out the above operations.

The characteristic acquisition unit 101 of the variation analysis unit 100 acquires characteristic data, such as current-voltage or capacitance-voltage characteristics, of a plural number of, herein N, target devices, the characteristics of which are varied due to variations. These characteristic data may be acquired by measuring N actually fabricated devices. Alternatively, the characteristic data may be acquired by generating N simulation devices on a computer, using e.g. the process simulation, which takes the variation phenomenon into account, and by computing the characteristics of these simulation devices by device simulation.

It is sufficient that the aforementioned measurement or process/device simulation are separately carried out and the resulting characteristic data are supplied to the characteristic acquisition unit 101. Alternatively, the function of the aforementioned measurement or process/device simulation may be included in the characteristic acquisition unit 101.

The characteristic acquisition unit 101 of the variation analysis unit 100 may perform conversion of characteristics, by converting characteristic data, using arbitrary functions, before extracting the aforementioned statistical data.

The statistical analysis unit 102 of the variation analysis unit 100 may perform statistical analysis on the aforementioned device characteristics data (data already subjected to characteristics conversion as necessary) to extract statistical data (data in abstract form). For this extraction processing, the principal component analysis may be applied.

The model acquisition unit 201 of the model analysis unit 200 acquires a device model for circuit simulation (center model) reproducing typical characteristics of the target devices. This model may be determined by selecting one of a large number of devices exhibiting center characteristics, and by executing a conventional parameter extraction procedure on the so selected device. It is sufficient that the parameter extracting procedure is separately executed and the set of the resulting parameters is supplied to the model acquisition unit 201. Alternatively, the function of executing the parameter extraction procedure may be included in the model acquisition unit 201.

The model acquisition unit 201 may also acquire the cause parameter information as later described. The so acquired information may be recorded in the memory unit 501 and then may be read and used by the simulation execution unit 400.

The response measurement unit 202 of the model analysis unit 200 measures how much device characteristics as computed by circuit simulation are varied against changes of a preset one or more of parameters (cause parameters).

That is, measurement is made of the response of device characteristics against change in the parameters. It is noted that, in case the characteristic acquisition unit 101 carries out the aforementioned conversion of characteristics, response measurement is made of device characteristics being converted by the same conversion of characteristics.

The cause parameters used may be selected from the parameters for circuit simulation constituting the center model. Alternatively, the parameter conversion as later described may be carried out as necessary and parameters different from the parameters for circuit simulation may be used as cause parameters.

In the aforementioned manner, a response matrix which represents the response of as-converted characteristic data to the cause parameter is obtained.

Figure 12:
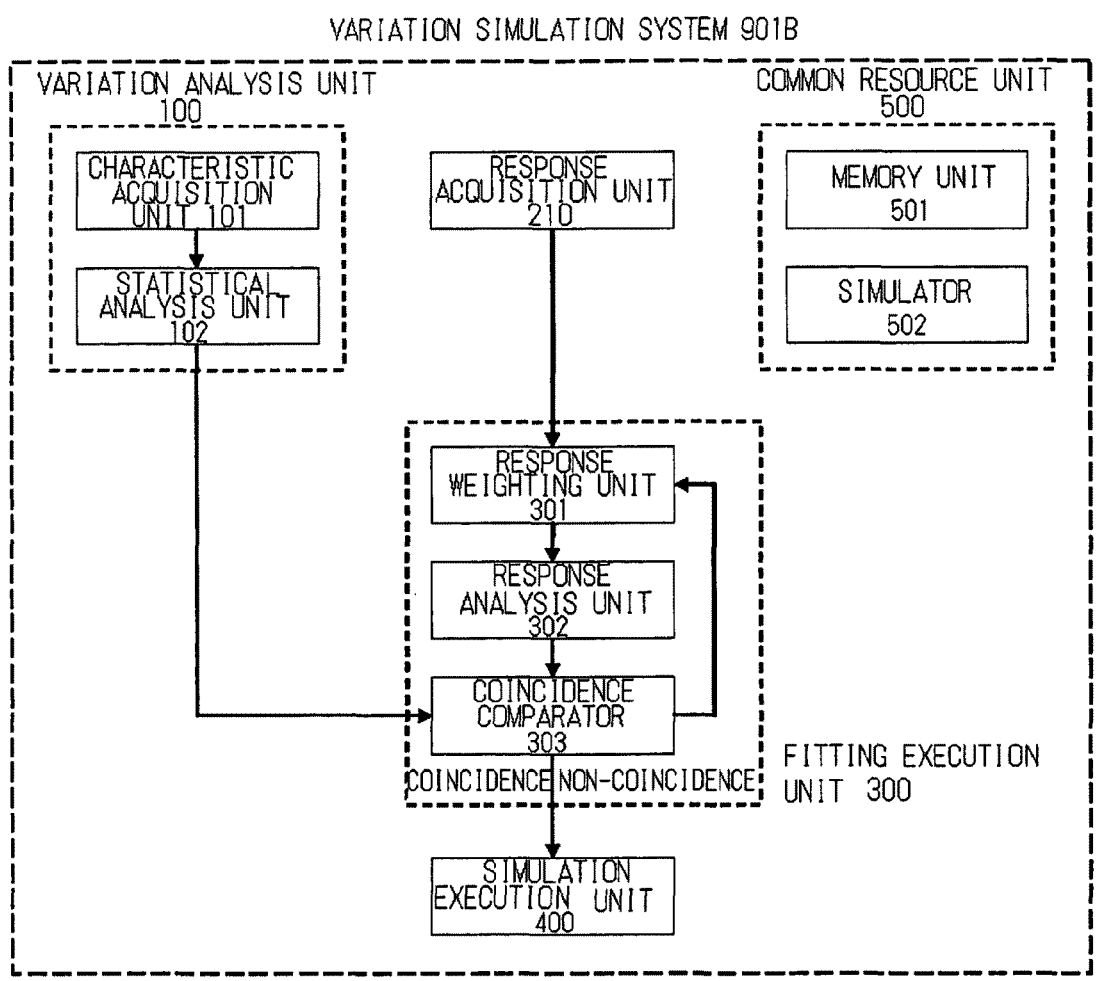
FIG. 12 is a block diagram showing the constitution of a modification of the first embodiment of the present invention.

In the foregoing description, the model analysis unit 200 itself acquires a device model and the response of the model is computed using the so acquired device model. However, the present invention is not limited to this technique provided that the model response may be acquired by some means or other. Thus, the model analysis unit 200 may be a response acquisition unit 210, as shown in FIG. 12. It is unnecessary to carry out model response decision repeatedly provided that the decision is made once for a given device model and the result is saved. It is therefore sufficient that, in case the model response has already been known, such model response is read by the response acquisition unit 210. It is also possible to separately carry out part of the sequence of operations for determining the model response, such as operation of executing the simulation with one or more parameters changed, or all of the above sequence of operations. In such case, the result of the operations may be read and used by the response acquisition unit 210.

The response weighting unit 301 of the fitting execution unit 300 sets the magnitude of the variation of each of the respective cause parameters, based on a preset search algorithm, and accordingly corrects the weights of the respective columns of the aforementioned response matrix. As an index of the magnitudes of the variations, the variance or the standard deviation may be used.

The response analysis unit 302 of the fitting execution unit 300 extracts the characteristics of the aforementioned response matrix. For this extraction, the singular value decomposition method may be used.

The coincidence comparator 303 of the fitting execution unit 300 compares the output of the statistical analysis unit 102 to the output of the response measurement unit 202 or the response acquisition unit 210. In case the preset condition of coincidence is met, the magnitude of the variation of the cause parameter is determined. In case the preset condition of coincidence is not met, control transfers to the response weighting unit 301 to continue the search.

The simulation execution unit 400 executes circuit simulation, as necessary, based on the so determined magnitude of the variation of the cause parameter. For example, Monte Carlo calculation is performed, in which circuit characteristics are computed a plural number of times as the cause parameter is statistically varied according to a distribution function, such as normal distribution, having a determined variance.

The simulation execution unit 400 may receive, via the memory unit 501, the center model used for the simulation, and the cause parameter information, as acquired by the model acquisition unit 201.

The memory unit 501 provides storage means needed for the above operations.

The simulator 502 executes circuit simulation in the above operations. The memory unit 501 or the simulator 502 may be unified with the variation simulation system 901 or may exist as an external module. It is of course possible that the processing or functions of the variation analysis unit 100, model analysis unit 200, fitting execution unit 300 or the simulation execution unit 400 is implemented by a program executed on a computer system that makes up the variation simulation system 901.

Figure 2:
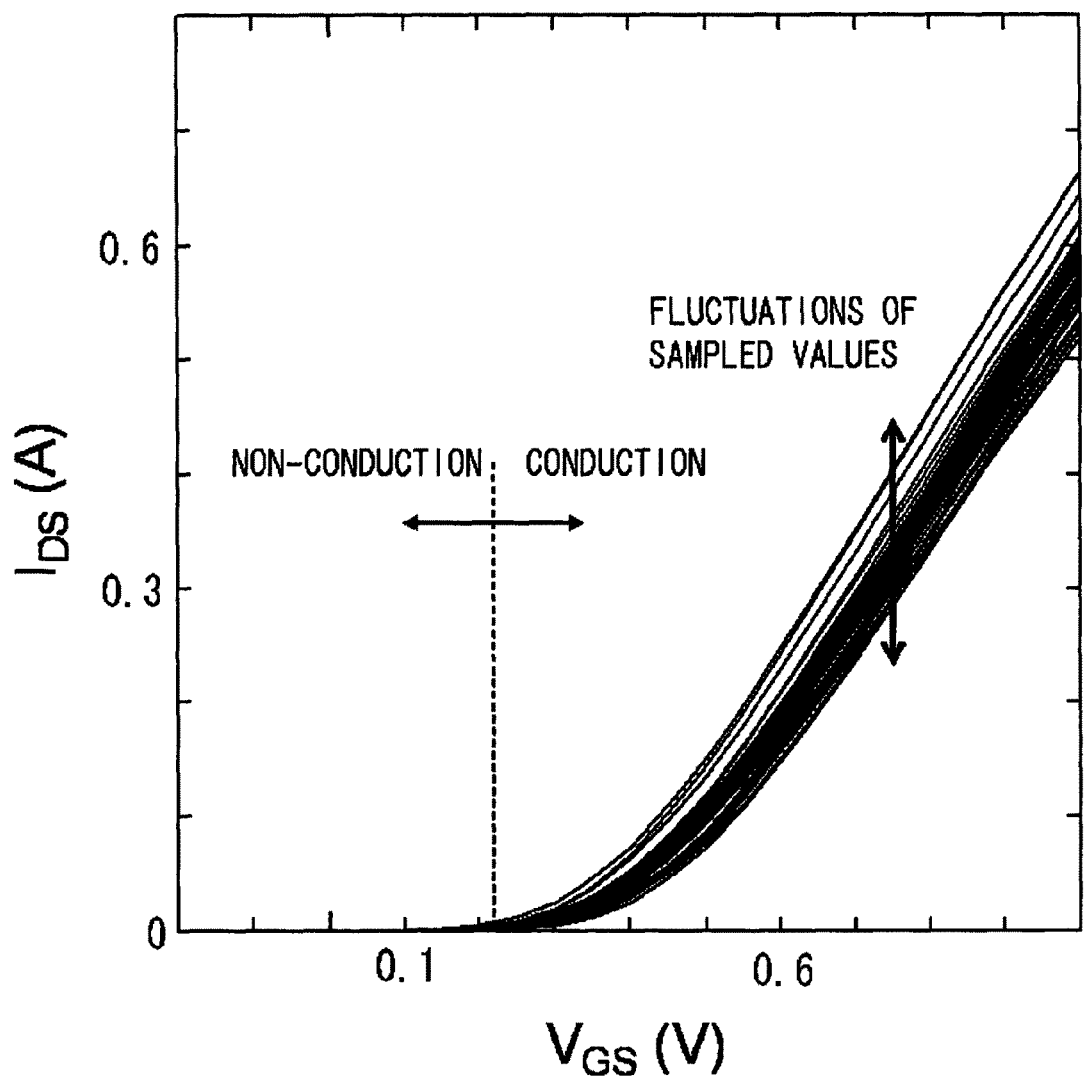
FIG. 2 is a graph showing a specified example of device characteristics for illustrating the operation of the first embodiment of the present invention.

Referring mainly to FIGS. 1 and 2, the overall operation of the present embodiment will now be described in detail. Although there are a large variety of the configurations of the present invention, a certain specified example is taken up here for assisting in the understanding the present invention.

The characteristic acquisition unit 101 of the variation analysis unit 100 acquires characteristic data of N devices. For example, this may be achieved by the characteristic acquisition unit reading in a preset file, having stored therein the characteristic data, under instructions by a user. These characteristic data may be provided by separately measuring real devices and by saving the results in a file in accordance with a preset format.

Typical desirable device characteristic data are values of measured data, such as current values or capacitance values, under a plural number of, herein n, preset bias conditions. In this case, the data are a list of numerical values having a certain number of elements equal to the number of bias points n multiplied by the number of devices N. The measured value under the i'th bias condition is considered to be a statistical variable and is stated as yi. The specific values of yi for N devices are considered to be sample values of the statistical variable yi.

Figure 3:
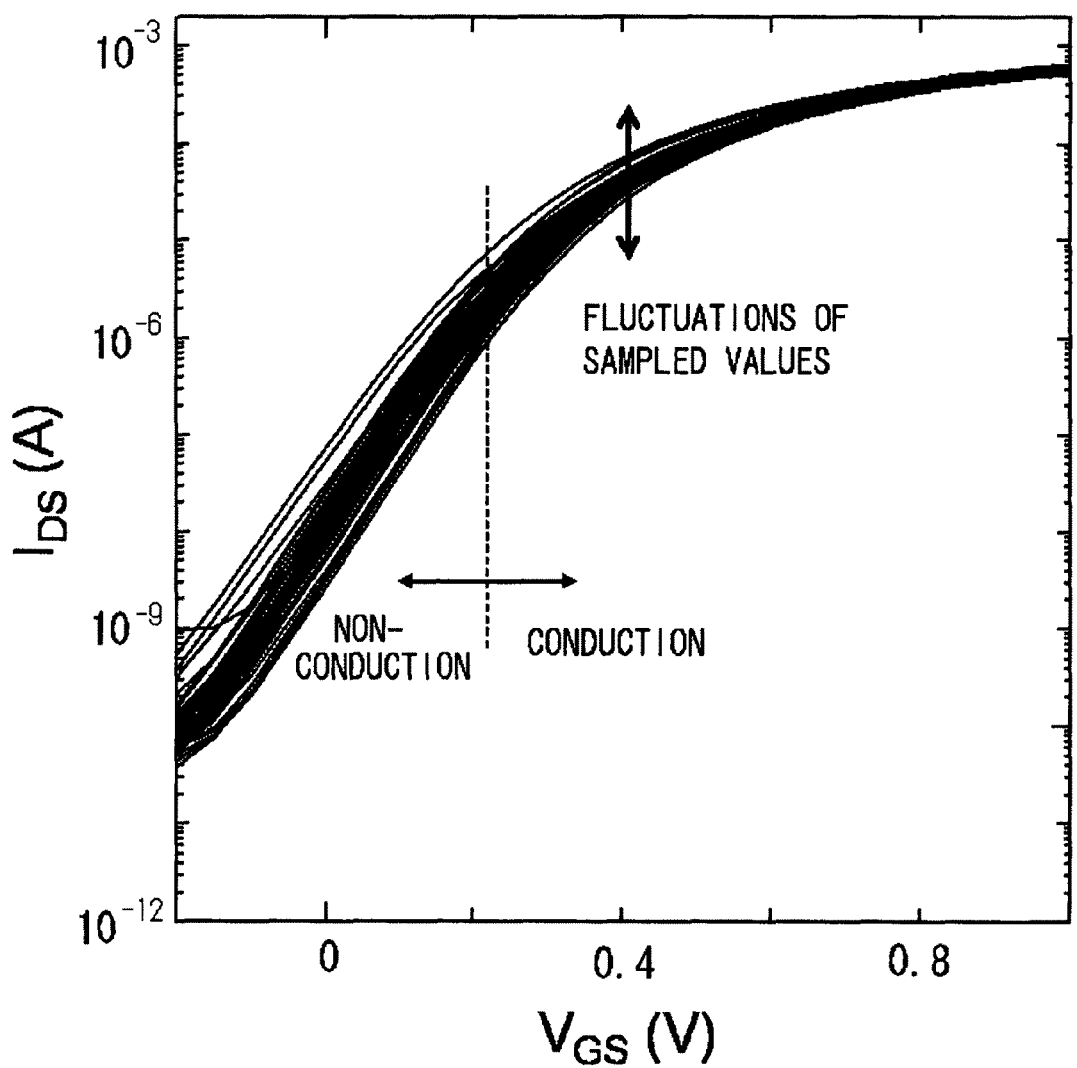
FIG. 3 is a graph showing a specified example of device characteristics for illustrating the operation of the first embodiment of the present invention.

Examples of the above device characteristic data are shown in FIGS. 2 and 3. Although FIGS. 2 and 3 show the same data, the linear scale and the log scale are used for the ordinates for FIGS. 2 and 3, respectively. FIGS. 2 and 3 show measured values of the drain-to-source current IDS of an n-channel MOSFET. As for the bias condition, the drain-to-source voltage VDS is 1V, the substrate-to-source voltage VBS is 0V and the gate-to-source voltage VGS is changed from −2V to 1.0V at steps of 0.05V.

A large number of curves stand for characteristics of MOSFETs designed so as to be macroscopically the same. However, these curves are spread apart from one another due to variations.

The curves on the graph appear to be continuous because the step of VGS is small. However, in actuality, each curve is made up of 25 discrete data along the horizontal axis (that is, n=25).

In the present example, the IDS under the i'th bias condition is the statistical variable yi and, due to variations, the N IDS values, which are sample values of yi, are varied statistically.

The characteristic acquisition unit 101 applies characteristics conversion to the statistical variables, as appropriate. Mathematically, the transformation of the following equation (1):

$$y_i' = f_i(y_1, y_2, \ldots, y_n) \ (i=1,2,\ldots,n') \tag{1}$$

where yi' is post-transformation statistical variable, is carried out.

The simplest method for characteristics conversion is to set each yi divided by constants as yi'. As this constant, an average value or a standard deviation of yi may be used. By so doing, data weight in each i may be adjusted such as to avoid overestimation or underestimation of the variations for a specific i.

The following equation (2) gives a preferred equation for transformation for the example of FIG. 3.

$$y_i' = \frac{y_i}{a} + \frac{\log(y_i/a)}{\log(a/b)} (i = 1, 2, \cdots, n', n' = n) \tag{2}$$

where a and b are constants.

Figure 4:
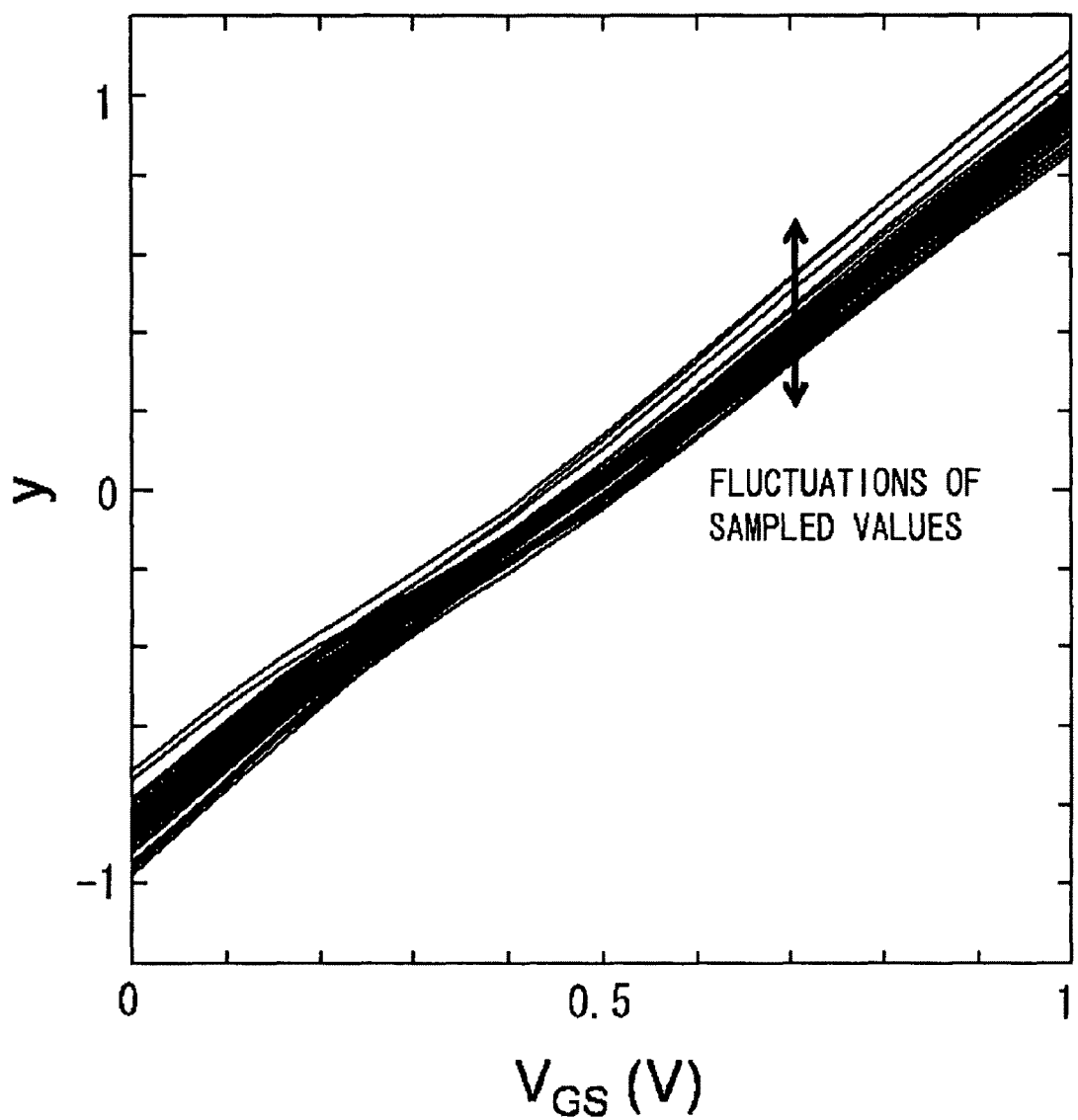
FIG. 4 is a graph showing a specified example of converted device characteristics for illustrating the operation of the first embodiment of the present invention.

FIG. 4 shows the relationship between yi', as transformed, and VGS, for a=0.3 mA and b=1 nA.

The following is the reason why the transformation of the equation (2) is preferred.

It is seen from FIG. 2 that, when VGS is large (the MOSFET is in a conducting state), the fluctuation of IDS, that is, yi, is large, and that, when VGS is small (the MOSFET is in a cut-off state), the fluctuation of IDS, that is, yi, may hardly be discerned from the drawing.

Thus, if statistical analysis is carried out for yi itself (in the statistical analysis unit as later described), the major part of the information on the fluctuation in the cut-off state is lost.

If reference is made to FIG. 3 in which the log scale is used for the ordinate, it is seen that there is extremely small leakage current, even in the cut-off state, with the magnitude of the leakage current varying appreciably on the log scale.

If desired to simulate the fluctuation in the cut-off state to high accuracy, it is not proper to use yi itself as the statistical variable.

If reference is made to FIG. 4, it is seen that, as a result of transformation of the equation (2), the fluctuation of yi' for the conducting state is approximately equal to that for the cut-off state.

Thus, with the use of the equation (2), the fluctuation in the conducting state and that in the cut-off state may be treated with an equivalent weight.

The equation of transformation (1) may suitably be selected so that the fluctuation of yi will be enhanced under a bias condition to which importance is to be attached as to fluctuation. As the case may be, there is no necessity to carry out the transformation, that is, yi' may be equal to yi (yi'=yi).

Insofar as the examples of FIGS. 2 and 3 are concerned, the equation (2) is proper for a case where importance is to be attached equally to the conducting state and to the cut-off state. If the fluctuation in the cut-off state may safely be disregarded, it is unnecessary to carry out the transformation.

If the method for transformation of characteristics is specified in this manner, it may be determined by the user as to which part of the device characteristics importance is to be attached to as regards the variations in carrying out the simulation.

It is not necessary that the number of the post-transformation statistical variables n' is equal to n. For example, if the number of bias points n in the measured data is unnecessarily large such that it is deterrent to subsequent processing, data may be thinned out as appropriate at the time of this transformation.

The post-transformation statistical variable may be any arbitrary characteristic value that may be extracted from measured data, such as threshold voltage or on-current (IDS under a preset conduction bias state).

The statistical analysis unit 102 carries out statistical analysis for the statistical variable yi' to extract statistical characteristics. As the technique for analysis, the principal component analysis may be used. Specifically, a co-variance matrix V of the following equation (3):

$$V = \begin{pmatrix} V_{11} & V_{12} & \cdots & V_{1n'} \\ V_{21} & V_{22} & \cdots & V_{2n'} \\ \vdots & \vdots & \ddots & \vdots \\ V_{n'1} & V_{n'2} & \cdots & V_{n'n'} \end{pmatrix}, V_{ij} = \overline{y'_i y'_j} - \overline{y'_i} \cdot \overline{y'_j} \quad (3)$$

is computed.

In the above equation, an overbar on the statistical variable indicates taking an average of the statistical variable. An eigenvalue and an eigenvector (having length normalized to 1) of the co-variance matrix V are found using a proper algorithm. That is, a unitary matrix L, which satisfies the following equation (4), is found (the unitary matrix is a square matrix the column/row vector lengths of which are all 1 and orthogonal to each other, and is related with rotation of coordinates with the length remaining unchanged).

$$VL = L \begin{pmatrix} \lambda_1 & 0 & \cdots & 0 \\ 0 & \lambda_2 & \ddots & \vdots \\ \vdots & \ddots & \ddots & 0 \\ 0 & \cdots & 0 & \lambda_{n'} \end{pmatrix}, L = \begin{pmatrix} l_{11} & l_{12} & \cdots & l_{1n'} \\ l_{21} & l_{22} & \cdots & l_{2n'} \\ \vdots & \vdots & \ddots & \vdots \\ l_{n'1} & l_{n'2} & \cdots & l_{n'n'} \end{pmatrix} \quad (4)$$

where $\lambda 1, \lambda 2, \ldots$ are eigenvalues and are sorted in decreasing order.

The column vector of L is the eigenvector sequentially related with $\lambda 1, \lambda 2, \ldots$ from the left side.

The unitary transformation of yi', given by the following equation (5), is termed the first principal component of yi', and has the maximum variance among any unitary transformations of yi', with the variance being equal to $\lambda 1$, in a known manner.

$$Z_1 = l_{11} y_1' + l_{21} y_2' + \ldots + l_{n1} y_n' \quad (5)$$

The next equation (6) is the second principal component and has the second largest variance $\lambda 2$. The principal components of the higher dimensions are defined in similar manner.

$$Z_2 = l_{12} y_1' + l_{22} y_2' + \ldots + l_{n2} y_n' \quad (6)$$

The different principal components are of zero co-variance, viz., are non-correlated.

Figure 5:
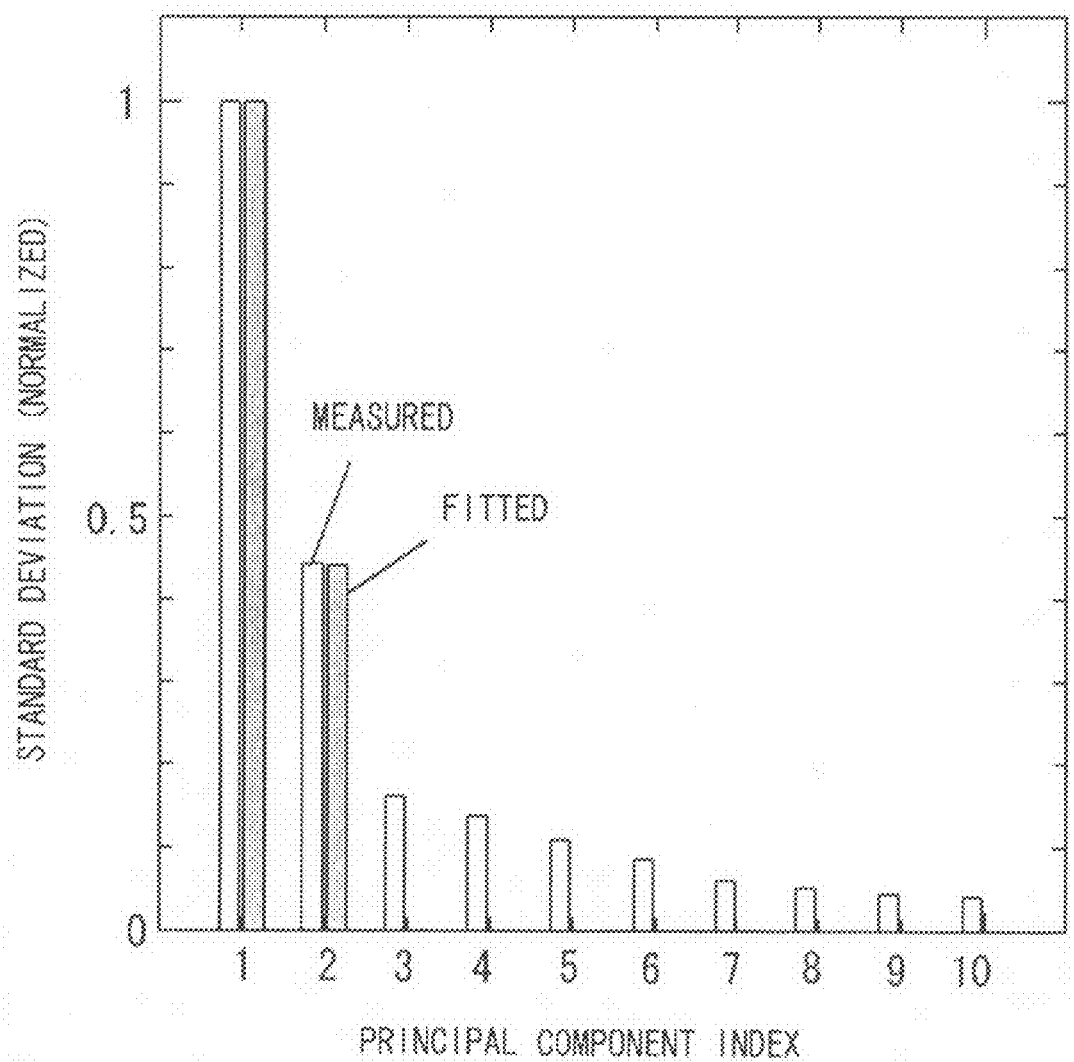
FIG. 5 is a bar graph showing a specified example of standard deviation of the principal component for illustrating the operation of the first embodiment of the present invention.
Figure 6:
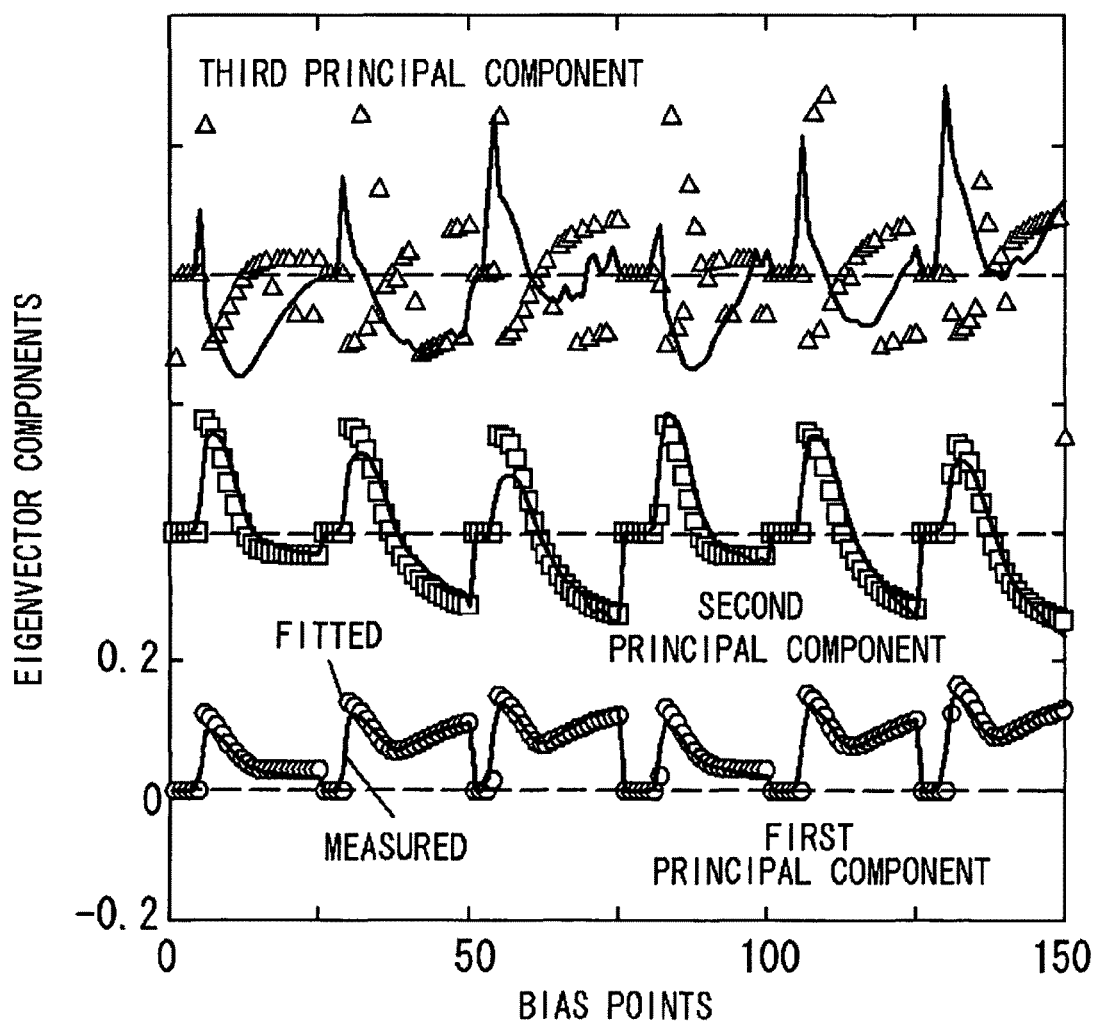
FIG. 6 is a graph showing a specified example of the eigenvector of the principal component for illustrating the operation of the first embodiment of the present invention.

FIGS. 5 and 6 show examples of the results of principal component analysis. In FIG. 5, the horizontal axis denotes the index of principal components and the vertical axis denotes the normalized standard deviation. The example shown in FIG. 5 shows the results of calculations with the use of data of a total of 150 bias points, for the example shown in FIGS. 2 to 4, in which other bias conditions are added. That is, the bias conditions include all the combinations of VDS of 1V, 0.525V or 0.05V, VBS of 0V or 0.5V and VGS from −2V to 1V in 0.02V step.

In FIG. 5, the open bars denoted 'measured' represent standard deviation of first to tenth principal components as obtained from the measured data (square root of variance normalized by that of the first principal component).

In FIG. 6, showing the relation between the bias points (horizontal axis) and the eigenvector elements, solid-line plots, denoted 'measured' represent eigenvector elements corresponding to the first to third principal components of the measured data.

For ease in viewing the graph, the plots of the second and third principal components are moved upwards by 0.4 and 0.8, respectively.

It is seen from the equation (4) that the eigenvector in the present example has n'=n=150 elements.

The model acquisition unit 201 acquires a center model. Device characteristics are varied by the variations. Center model is a device model corresponding to a device that rests at the center of the range of the variations. Stated differently, the device model corresponding to a typical device characteristic is the center model.

The center model may be obtained by selecting one of many devices exhibiting center characteristics and by carrying out a conventional parameter extraction procedure thereon.

Meanwhile, the definition of the center is not unique. For example, among N MOSFETs, a sample MOSFET, the threshold value of which assumes a median value, is not necessarily coincident with a sample MOSFET the on-current of which assumes a median value. That is, a center model will vary depending on which of these is selected. The variation simulation according to the present invention may be carried out with an arbitrarily selected center model as a reference.

The model acquisition unit 201 of the model analysis unit 200 acquires the cause parameter information as necessary.

The cause parameters are parameters the statistical variations of which are considered to generate variations of device characteristics. How the variations of the cause parameters bring about variations of respective parameters making up a device model is defined.

That is, cause parameters are related with device model parameters by, for example, following equation (7), where Pi is a cause parameter and pj is a parameter of a device model, the number of cause parameters being M and the number of the device model parameters being m.

$$P_j = g_j(P_1, P_2, \ldots, P_M)(j=1, \ldots, m) \quad (7)$$

The information as to what are the cause parameter and how they are correlated with device model parameters is termed as 'cause parameter information'.

Cause parameter information can be described by using a mathematical equation, as equation (7).

The information as to what are the cause parameters and how they are correlated with device model parameters may be arbitrarily set by a user based on his/her knowledge or experience in the field of physics. By allowing the cause parameter information to be arbitrarily set by a user, the flexibility of the system for variation simulation according to the present invention can be improved. As a special case, a given cause parameter may be the same as one of device model parameters.

As a further special case, in the above equation (7), one of the device model parameters may be a function of the other device parameter which is one of the cause parameters.

Preferably, the number m of the device model parameters is a necessary minimum number not less than unity (1). Since a cause parameter may affect a plural number of device model parameters, the number of cause parameters is normally smaller than or equal to the number m of the device model parameters. By setting the number M of the cause parameters to a necessary minimum number smaller than the number m of the device model parameters, it becomes possible to execute subsequent simulation more easily.

By way of an example, the device size, such as gate length in the aforementioned MOSFET example, is usually included as one of device model parameters. In many cases, device size fluctuation gives rise to variations in device characteristics. It is therefore reasonable to have the size, as the device model parameter, treated itself as one of the cause parameters.

However, in general, there are cases where the cause of a given fluctuation does not match with one of the device model parameters.

It is desirable in such case to define a proper cause parameter different than a parameter used for a device model and to use the so defined cause parameter. As an example, a case where the impurity concentration in MOSFETs exhibits non-uniformity is considered. Since there lacks the concept of concentration non-uniformity in a device model used in a routine circuit simulator, it is not possible to represent the effect of the concentration non-uniformity by a sole parameter making up the device model.

Suppose that it is known by some means, such as experiments or device simulation, in the form of an equation such as equation (7), how the parameters making up a device model are changed with the magnitude of the concentration non-uniformity. Then, it becomes possible to correctly reproduce the variations in characteristics, ascribable to the concentration non-uniformity, by circuit simulation, by employing the magnitude of the concentration non-uniformity as the cause parameter.

By defining the cause parameter in this manner, and using the so defined cause parameter, the variation phenomenon may be correctly reflected in the circuit simulation, without correcting the pre-existing device model, even in cases wherein the parameters making up the device model are not in one-to-one correspondence with the causes of the variations.

There are also cases where, even if a given cause of the variations coincides with one of the device model parameters, changes in characteristics of a device model, caused by a displacement of the parameter, such as LG, do not agree with those of a real device, if the device model or the model basis is not ideal. In such cases, it is sufficient to select the parameter as the cause parameter and to have other parameters of the device model change as a function of the aforementioned parameter (cause parameter), according to an equation such as (7), so that changes in characteristics of the device model caused by a displacement of the aforementioned parameter will be coincident with those of the real device.

By so doing, it becomes possible to have the variation phenomenon correctly reflected in the circuit simulation without correcting the pre-existing device model or the model basis.

By defining the concept of the cause parameter as it is logically isolated from the device model parameter, it becomes possible to correctly reproduce the variations, by the circuit simulation, even in cases where the cause of the fluctuation matches with none of the device model parameters, or the device model is incomplete.

Preferably, the respective cause parameters are selected so that the cause parameters are related with respective different physical factors, so that the different cause parameters will be statistically non-correlated, or virtually non-correlated, with one another. In case the cause parameters are non-correlated with one another, in this manner, the representation of the variation phenomenon by the model may be simplified to enable facilitated execution of fitting and simulation.

Preferably, the cause parameters are selected for matching to the cause of the physical variations. However, the cause parameters do not have to be necessarily selected in this manner. The object of the present invention may be accomplished if it is possible to reproduce the observed variations by simulation. The present invention is useful even if the cause parameter is merely a fitting parameter having no physical meaning. It is however desirable that the cause parameter is selected so as to have physical meaning, since then it helps understand the physical understanding of the variation phenomenon.

The response measurement unit 202 checks the response of device characteristics to the cause parameter by circuit simulation, based on a center model acquired by the model acquisition unit 201.

In this case, the response measurement unit 202 actuates and derives the results from the simulator 502 as necessary.

The response measurement unit 202, by shifting each of the M cause parameters from the center by a preset amount, examines the displacement of the device characteristics as calculated by circuit simulation. Normally, the device characteristics, as used here, are to be equivalent to those used in the variation analysis unit 100.

For example, in the above practical example, the current-to-voltage characteristics, obtained by simulation under the same bias conditions as those used for actual measurement, are used as the device characteristics. In case the conversion of characteristics is performed by the characteristic acquisition unit 101, the characteristic values, after subjected to the same conversion of characteristics, are used.

The response of device characteristic values to the cause parameters is a transformation in which n' outputs are obtained from M inputs, and hence may be represented as a matrix.

The displacement of the i'th transformed characteristic value yi', when the j'th cause parameter Pj has been displaced by a preset displacement amount $\Delta Pj$, is calculated, and divided by $\Delta Pj$ to give rij, where i=1, ..., n', j=1, ..., M. A matrix R0, having rij as an element of i'th row and j'th column, is defined as a reference response matrix (see the following equation (8)).

$$R_0 = \begin{pmatrix} r_{11} & \cdots & r_{1M} \\ \vdots & \ddots & \vdots \\ r_{n'1} & \cdots & r_{n'M} \end{pmatrix} \quad (8)$$

The following explanation is based on the above-described practical example. If, for example, the gate length LG is the cause parameter, the current-to-voltage characteristics of the MOSFET are calculated by circuit simulation, as LG is diminished by $\Delta LG/2$. The current IDS at each bias point, that is, yi, is computed, and transformation according to the equation (1), more specifically, to the equation (2), is carried out to compute yi'.

Similar calculations are carried out as LG is increased by $\Delta LG/2$ to compute yi'.

Then, yi' obtained by the former calculations is subtracted from yi' by the latter calculations to find the displacement of yi'.

Meanwhile, in calculating the displacement of yi', it is preferred to perform the calculations as Pj is displaced from the center value in both the positive and negative directions (by $-\Delta Pj/2$ and $+\Delta Pj/2$).

In the above explanation, it is assumed that the model analysis unit 200 acquires the device model for itself and uses it to compute the model's response. This technique is not to be interpreted restrictively provided that the model's response may be acquired by some means or other. That is, it suffices that the model analysis unit 200 is able to acquire the model's response by any suitable means, and the model analysis unit 200 of FIG. 1 may be the response acquisition unit 210 as in FIG. 12.

For example, part or all of the sequential operations determining the model's response may be separately executed and the results may then be read out and used. More specifically, the response acquisition unit 210 is able to directly read out the respective elements of the aforementioned reference response matrix R0.

In addition, the response acquisition unit 210 may be adapted to read in a set of data necessary for the response acquisition unit 210 to compute the respective elements of the response matrix. For example, the response acquisition unit 210 may read in a set of magnitudes of the characteristic values yi, in case the cause parameter Pij is displaced by preset amount of displacement $+\Delta Pj/2$ and $-\Delta Pj/2$, for all combinations of i and j, to compute the respective elements of the response matrix R0 based on the so read-in data.

The response weighting unit 301 postulates, based on a preset search algorithm, a trial value of the magnitude of variations (standard deviation) of each cause parameter, as appropriate.

If the trial values are labeled $\sigma1, \sigma2, \ldots$, and $\sigma M$, each column of the reference response matrix R0 is weighted to derive a response matrix R (see the next equation (9)).

$$R = R_0 \begin{pmatrix} \sigma_1 & 0 & \cdots & 0 \\ 0 & \sigma_2 & \ddots & \vdots \\ \vdots & \ddots & \ddots & 0 \\ 0 & \cdots & 0 & \sigma_M \end{pmatrix} = \begin{pmatrix} r_{11}\sigma_1 & \cdots & r_{1M}\sigma_M \\ \vdots & \ddots & \vdots \\ r_{n'1}\sigma_1 & \cdots & r_{n'M}\sigma_M \end{pmatrix} \quad (9)$$

The postulated value of the standard deviation may be zero. The search algorithm used may be any of known techniques, such as simulated annealing.

For the above search, it is possible to set constraint conditions, as appropriate. For example, certain ones of variations of the cause parameters may be of constant magnitudes for search.

It is assumed for example that the size of the actual device is measured at the outset and the magnitude of the variations of the gate length LG has already been known. In this case, it is not reasonable to set the magnitude of the LG variations as the subject of search. It is then reasonable to carry out the search as the magnitude of the variations of the preset cause parameter, herein LG, is maintained at a constant value known from the outset.

The analysis unit 302 extracts the characteristics of the response matrix R. As the technique for extraction, the singular value decomposition method may be used. That is, the response matrix R is resolved into a product of three matrices:

$$R = HSA^T \quad (10)$$

$$= \begin{pmatrix} h_{11} & h_{12} & \cdots & h_{1M} \\ h_{21} & h_{22} & \cdots & h_{2M} \\ \vdots & \vdots & \ddots & \vdots \\ h_{n'1} & h_{n'2} & \cdots & h_{n'M} \end{pmatrix} \begin{pmatrix} s_1 & 0 & \cdots & 0 \\ 0 & s_2 & \cdots & 0 \\ \vdots & \vdots & \ddots & 0 \\ 0 & 0 & \cdots & s_M \end{pmatrix}$$

$$\begin{pmatrix} a_{11} & a_{21} & \cdots & a_{M1} \\ a_{12} & a_{22} & \cdots & a_{M2} \\ \vdots & \vdots & \ddots & \vdots \\ a_{1M} & a_{2M} & \cdots & a_{MM} \end{pmatrix}$$

where H is a matrix in which the column vectors are of length 1 and orthogonal to one another, A is a unitary matrix, and S is a diagonal matrix. The respective diagonal elements of the matrix S are termed singular values of the matrix R. The singular values are sorted in the order of the decreasing magnitudes.

The coincidence comparator 303 compares an output of the statistical analysis unit 102 to an output of the response measurement unit 202 to decide on whether or not the desired coincidence condition has been met, in other word, whether or not the fitting has been achieved.

In case the coincidence has been achieved, s1, s2, ... and sM at this time are adopted as the magnitudes of standard deviation of the respective cause parameters. If coincidence has not been achieved, processing transfers to the response weighting unit 301 to continue the search.

In case the principal component analysis and the singular value decomposition are used for the statistical analysis and for the response analysis, coincidence may, for example, be determined as follows:

That is, the conditions for coincidence are assumed to be as follows:

the eigenvalue λ1 of the first principal component and a square of the maximum singular value s1 are coincident with each other within a preset error range; and the first column vector of the matrix L is coincident with the first column vector of the matrix H within a preset error range.

If necessary, the followings are added to the conditions:

the eigenvalue λ2 of the second principal component and a square of the second largest singular value s2 are coincident with each other within a preset error range; and the second column vector of the matrix L is coincident with the second column vector of the matrix H within a preset error range In similar manner, the eigenvalue λi of the i'th principal component and a square of the i'th largest singular value si being coincident with each other within a preset error range and the i'th column vector of the matrix L being coincident with the i'th column vector of the matrix H within a preset error range are added to the condition, as necessary.

The foregoing represents an example in which an error is prescribed based on the difference between λi and si and on the difference between the i'th column vector of the matrix L and j'th column vector of the matrix L. However, an error may also be prescribed based on the difference between the i'th column vector of the matrix L multiplied by a square root of λi and the i'th column vector of the matrix H multiplied by si. It is also possible to check the coincidence for each i as described above or to prescribe the error by some or other function of the error for each i, such as a square sum of errors of from i=1 to i=3. The difference between the vectors themselves may be defined by, for example, the distance of the difference vector.

The reason the above decision is valid will now be described. The vectors x and y are defined by the following equation (11):

$$x = \begin{pmatrix} (P_1 - \overline{P_1})/\sigma_1 \\ (P_2 - \overline{P_2})/\sigma_2 \\ \vdots \\ (P_M - \overline{P_M})/\sigma_M \end{pmatrix}, y = \begin{pmatrix} y'_1 - \overline{y'_1} \\ y'_2 - \overline{y'_2} \\ \vdots \\ y'_{n'} - \overline{y'_{n'}} \end{pmatrix} \quad (11)$$

where σi is the standard deviation of the cause parameter Pi, and yi' is the post-transformation characteristic value, as calculated by the circuit simulation. The overbar on the statistical variable means the average value of the statistical variable concerned.

In this case, the approximate relationship $$y = Rx \quad (12)$$

holds.

In this case, in consideration that an average value of the respective elements of x is zero, the co-variance matrix V of yi' by the circuit simulation is given by the following equation (13):

$$V = \overline{(Rx)(x^T R^T)} = R\overline{xx^T}R^T = RR^T \quad (13)$$

where an overscript T applies to the matrix on its left side and denotes its transpose.

The singular value decomposition of R gives the following equation (14):

$$R = HSA^T$$

$$RR^T = HSA^T ASH^T = HS^2 H^T$$

$$RR^T H = HS^2$$

$$VH = HS^2 \quad (14)$$

On comparison of the above equation with the equation (4), the column vector of the matrix H is the eigenvector of the co-variance matrix V by circuit simulation, and the square of the singular value is equal to the eigenvalue of the co-variance matrix V by circuit simulation.

Thus, the fluctuation in the actually measured values may be reproduced on circuit simulation by selecting the cause parameters and standard deviation σ1, σ2, ... σM so that the square of the singular value will be coincident with the eigenvalue of the co-variance matrix V obtained by actual measurement (viz. the variance of the principal component) and so that the column vector of the matrix H will be coincident with the eigenvector of the co-variance matrix V obtained by actual measurement.

FIGS. 5 and 6 show the results of fitting for the above-described practical example. As the simulator 502, BSIM4, a simulator commonly used in business circles, is used. As the cause parameters, a parameter of the device model, termed VOFF (offset voltage in sub-threshold region for large W and L), is used in addition to the gate length LG.

On adjustment of the standard deviations of these two cause parameters, the standard deviation of the first principal component and that of the second principal component could be made to coincide with actually measured values, as shown by the graph labeled 'FITTED' in FIG. 5.

Moreover, as indicated by ○, □ and Δ, with indication of 'FITTED' in FIG. 6, the eigenvector components could be made to coincide approximately with measured results. However, the high index principal components higher than the third principal component cannot be reproduced, since only two cause parameters are used. If desired to obtain fitting to higher accuracy, it is sufficient to introduce more cause parameters.

However, since the higher order principal components exhibit the effects which become progressively smaller, the fitting up to the second principal component are sufficient in most cases.

The simulation execution unit 400 executes circuit simulation, as appropriate, based on the variation model. Meanwhile, the information on the cause parameters and the information on how the cause parameters are varied are referred to in their entirety as 'variation model'.

The information on how the cause parameters are varied at least includes the information on the magnitude of the variations of the cause parameters. Additionally, the information on how the cause parameters are varied may also include the information on the detailed distribution function of the fluctuation of the cause parameters.

As typical of the methods for exploiting the circuit simulation is the Monte Carlo experiment. That is, a variety of circuit characteristics are iteratively computed to scrutinize how circuit characteristics are varied, as the cause parameters are statistically varied with a preset distribution function, with the use of random numbers. In the absence of designation for a particularly detailed distribution function, it is reasonable to use a standard normal distribution with a preset standard deviation.

More specifically,

Step 1:

Based on the information on how the cause parameters are varied, a set of cause parameters P1, P2, ..., and PM, displaced from the average value, are determined, using random numbers. For example, the cause parameters are displaced by a preset distribution function having the standard deviation as determined by the fitting execution unit 300. If the cause parameters are uncorrelated, it is sufficient to select the cause parameters independently of one another.

Step 2:

From the above set of the displaced cause parameters, displaced device model parameters p1, p2, . . . , and pm are determined, using the equation, such as the equation (7), that is, the cause parameter information.

Meanwhile, it is usually natural to select the relationship between the cause parameters and the parameters of the device model, so that, when all of the cause parameters are set to average values, the device model will be coincident with the center model.

Step 3:

Using the displaced model, as determined, circuit simulation is carried out, as appropriate, to scrutinize circuit characteristics.

By repeating a preset number of the trial operations, in which each trial operation is the above sequence of operations, it is possible to comprehend, from the results obtained, how the circuit characteristics are varied.

For executing the above-described circuit simulation, the information such as the device model, desirably a center model, and the condition for executing the simulation (the information on the constitution of the circuit inclusive of the device or the bias condition for simulation) are required, in addition to the variation model.

The simulation execution unit 400 is able to receive the information, already acquired by the model acquisition unit 201 (e.g. cause parameter information or the center model), via memory unit 501.

As for the condition for executing the simulation, it is sufficient that such condition may be acquired by the simulation execution unit 400, as appropriate, using a method used for routine circuit simulation, not shown.

Figure 7:
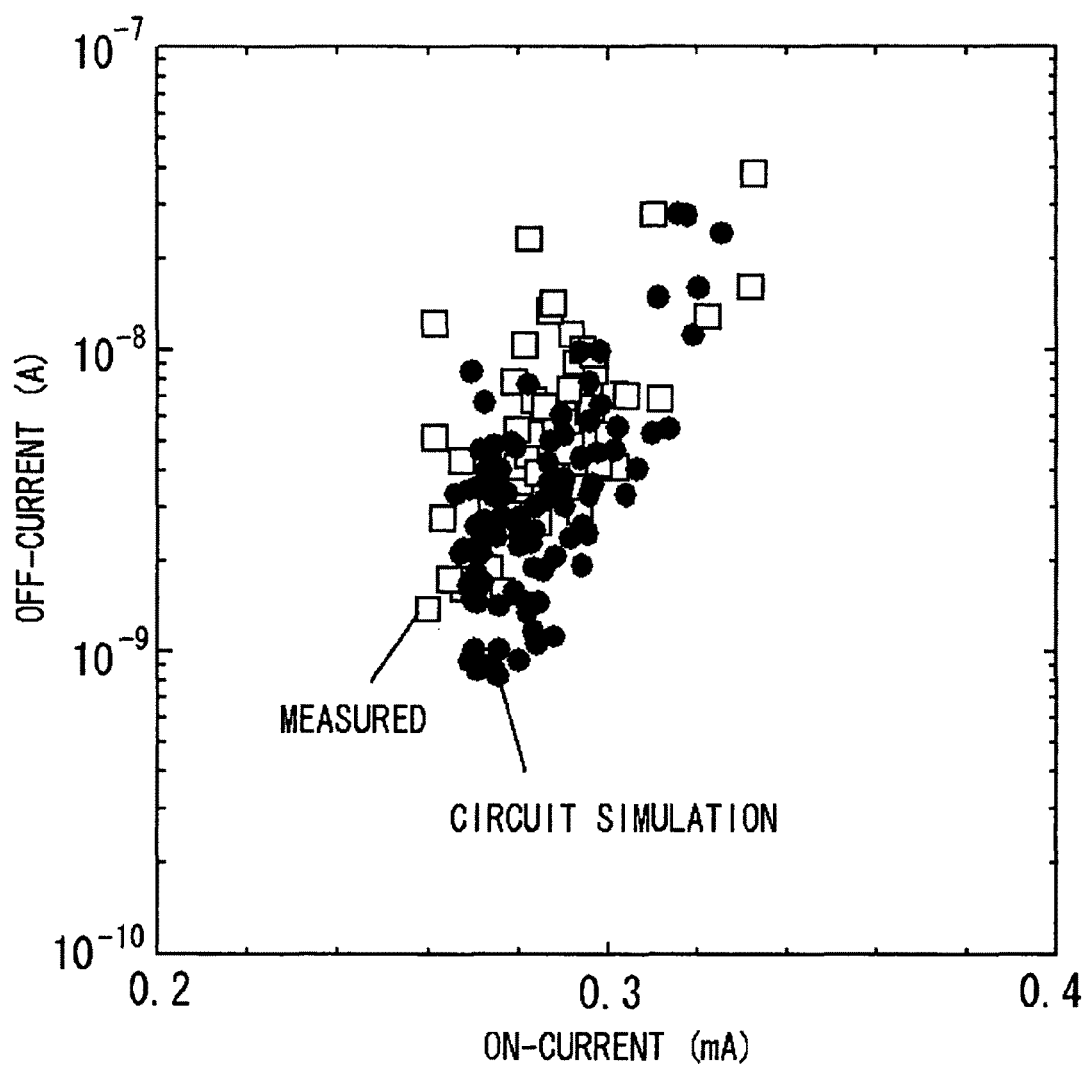
FIG. 7 is a graph showing a specified example of Monte Carlo test results for explanation of the operation of an embodiment of the present invention.

FIG. 7 shows the results of a Monte Carlo experiment employing the circuit simulation in the above-described practical example. Specifically, FIG. 7 shows the relationship between the MOSFET on-current (IDS for VDS=VGS=1V, VBS=0V, a representative current value during current on time) and the off-current (IDS for VDS =1V, VGS=VBS=0V, a representative current value during current off time). In FIG. 7, the symbol □, labeled 'measured', stands for measured data, while the symbol ●, labeled 'circuit simulation' stands for the results calculated by circuit simulation as the LG and the VOFF are varied randomly with a standard normal distribution, based on the variation model, obtained by the fitting described above. It is seen that the circuit simulation employing the variation model reproduces the state of variations of the actual measurement.

Here, the current value of the MOSFET per se is calculated by circuit simulation. In similar manner, it may be clarified how variations in the actual device characteristics affect circuit characteristics by calculating the characteristics (e.g. delay time or transmission characteristics) of arbitrary circuit configurations.

By so doing, it becomes possible to scrutinize in detail, by circuit simulation, what effect the variations in the device characteristics will have on circuit characteristics, without the necessity of actually fabricating the circuit. The results may be reflected in the circuit design to design a circuit with the reduced effect of variations.

In case the target circuits include a plural number of devices, the simulation execution unit 400 is able to displace the model for each device. If the plural devices differ in characteristics from one another, different variation models may be used for the respective devices to determine the model displacements.

Examples of such circuits are a circuit employing devices of different sizes, and a CMOS circuit employing an n-channel MOSFET and a p-channel MOSFET in combination.

The processing by the variation analysis unit 100, model analysis unit 200 and the fitting execution unit 300 may be carried out a plural number of times, as appropriate, for determining the plural variation models in keeping with the above object. By so doing, a plural number of center models and a plural number of variation models, related with a plural number of devices, may be produced.

The meritorious effect of the present embodiment will now be described with reference to FIGS. 8 and 9.

Figure 8:
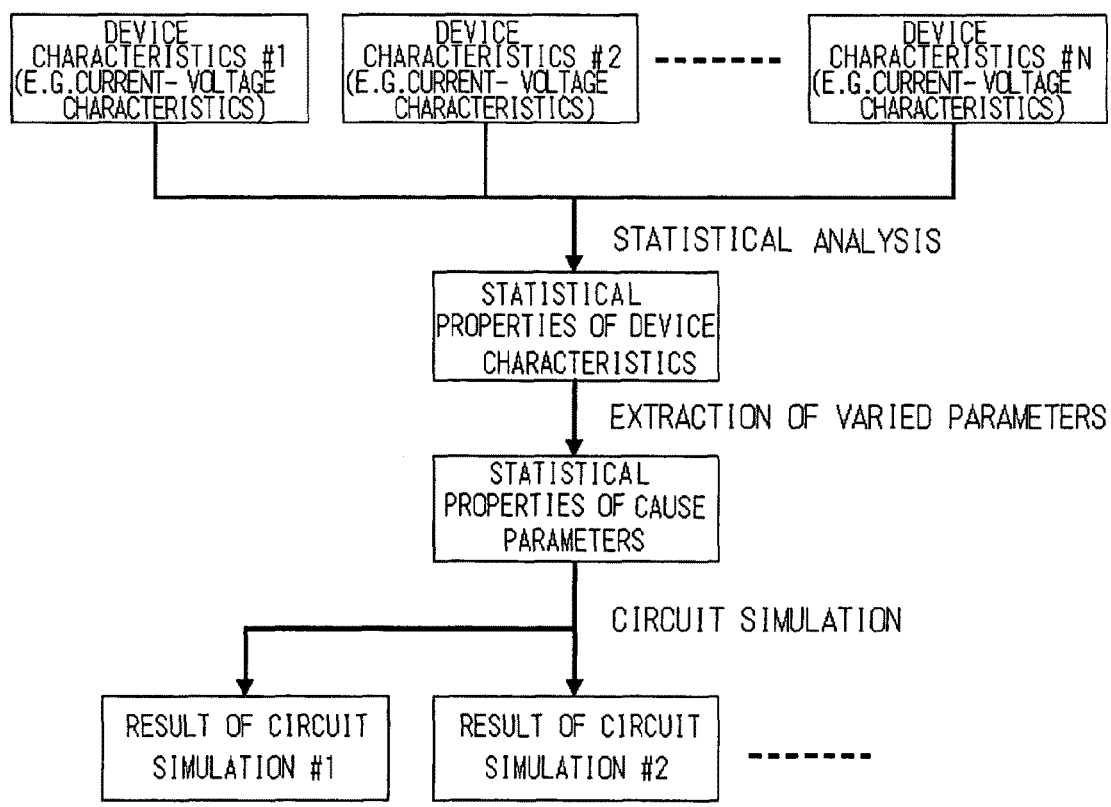
FIG. 8 is a diagram for illustrating data flow according to the present invention.

FIG. 8 shows data flow in the present embodiment. From characteristic data of a large number of, herein N, devices (device characteristics #1 to device characteristics #N), statistical properties of the device characteristics are first extracted by statistical analysis. For extracting the statistical properties, processing with small computational complexity, such as principal component analysis, may be used.

Then, for enabling reproduction of these statistical properties, the statistical properties of the cause parameter for the circuit simulation are determined. This operation of determining the statistical properties is the parameter fitting operation exploiting a search algorithm and involves considerable computational complexity. However, this operation needs to be carried out only once.

Then, circuit simulation may be carried out, as appropriate, based on the statistical properties of the cause parameter.

Figure 9:
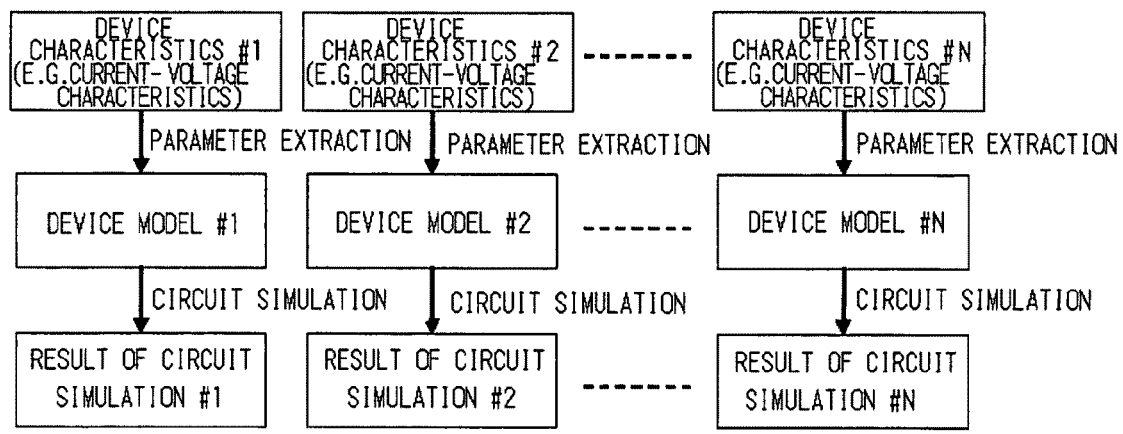
FIG. 9 is a diagram for illustrating data flow according to a conventional method.

FIG. 9 shows the flow of data in a conventional technique described in the above Patent Document 1, given as a Comparative Example. In this conventional technique, data of a large number of (N) devices, having variations, are used, as in the present embodiment. However, in the conventional technique, parameter extraction is carried out for each device. This is again the parameter fitting operation. Hence, the processing with considerable computational complexity needs to be carried out N times. Then, circuit simulation is carried out, using the N models obtained (device model #1 to device model #N), to derive the results of circuit simulation. Since the individual device characteristics and the results of simulation of the individual circuits are correlated in one-to-one correspondence, there is another deficiency that flexible circuit simulation cannot be executed.

Since the variation model can be extracted in the present embodiment by carrying out the parameter fitting operation only once, the circuit simulation, which takes variations into account, may be improved in efficiency.

Moreover, in the present embodiment, a 'variation model', abstracted from the actual variation phenomenon, may be produced. As a result, the circuit simulation, such as Monte Carlo experiment, may flexibly be carried out without restraint from characteristics of the individual devices used for measurement.

Figure 10:
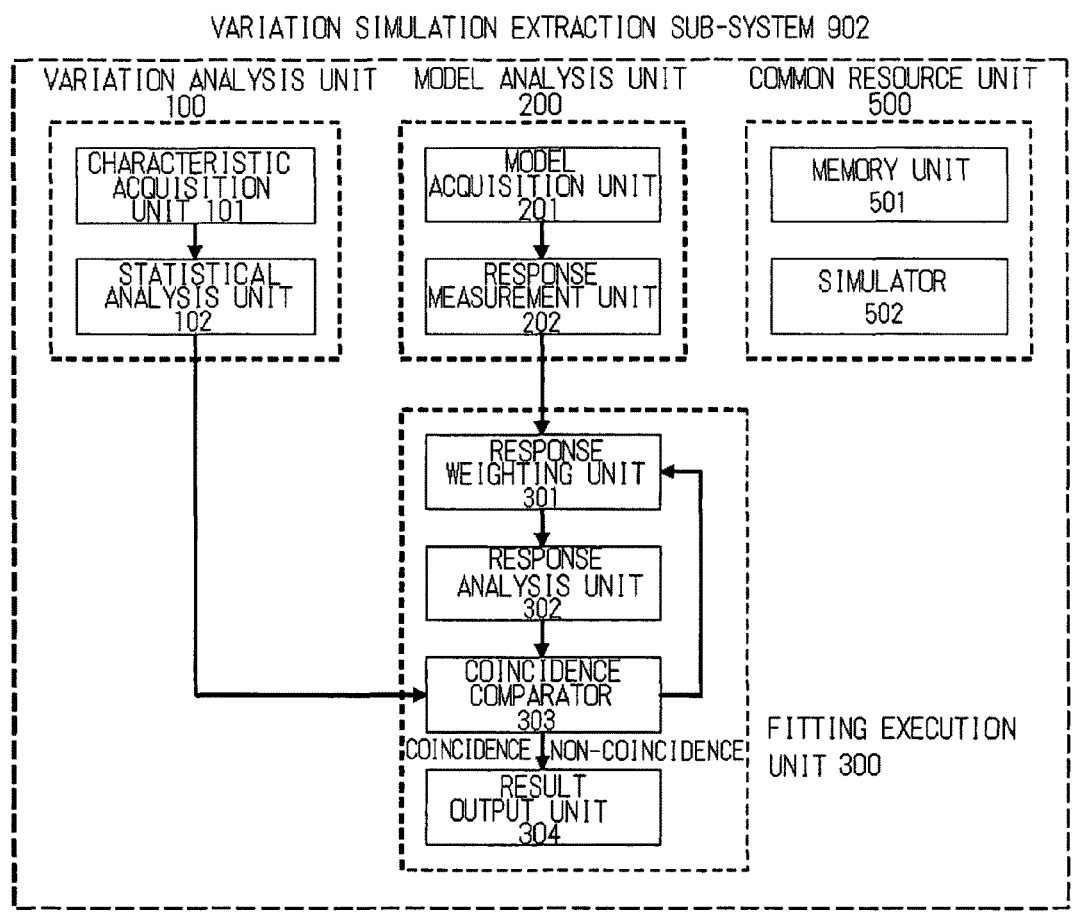
FIG. 10 is a block diagram showing the constitution of a second embodiment of the present invention.

A second embodiment of the present invention will be described in detail with reference to the drawings. Referring to FIG. 10, the second embodiment of the present invention is a variation simulation extraction sub-system 902. The configuration of the present second embodiment corresponds to that of the above-described first embodiment except that the simulation execution unit 400 of the first embodiment is omitted and, in its stead, a result output unit 304 is added. In FIG. 10, the components denoted by the same reference numerals as those used in FIG. 1 are equivalent to the corresponding components of FIG. 1.

The result output unit 304 outputs at least the determined magnitude of the variations of the cause parameter of the variation model, preferably the entire variation model. The output form is desirably matched in order to enable direct readout thereof by a variation simulation extraction sub-system 903 which will be described later in connection with a third embodiment.

The present embodiment differs from the first embodiment in that the variation model as extracted is not delivered directly to the simulation execution unit 400 but is output via result output unit 304.

Figure 13:
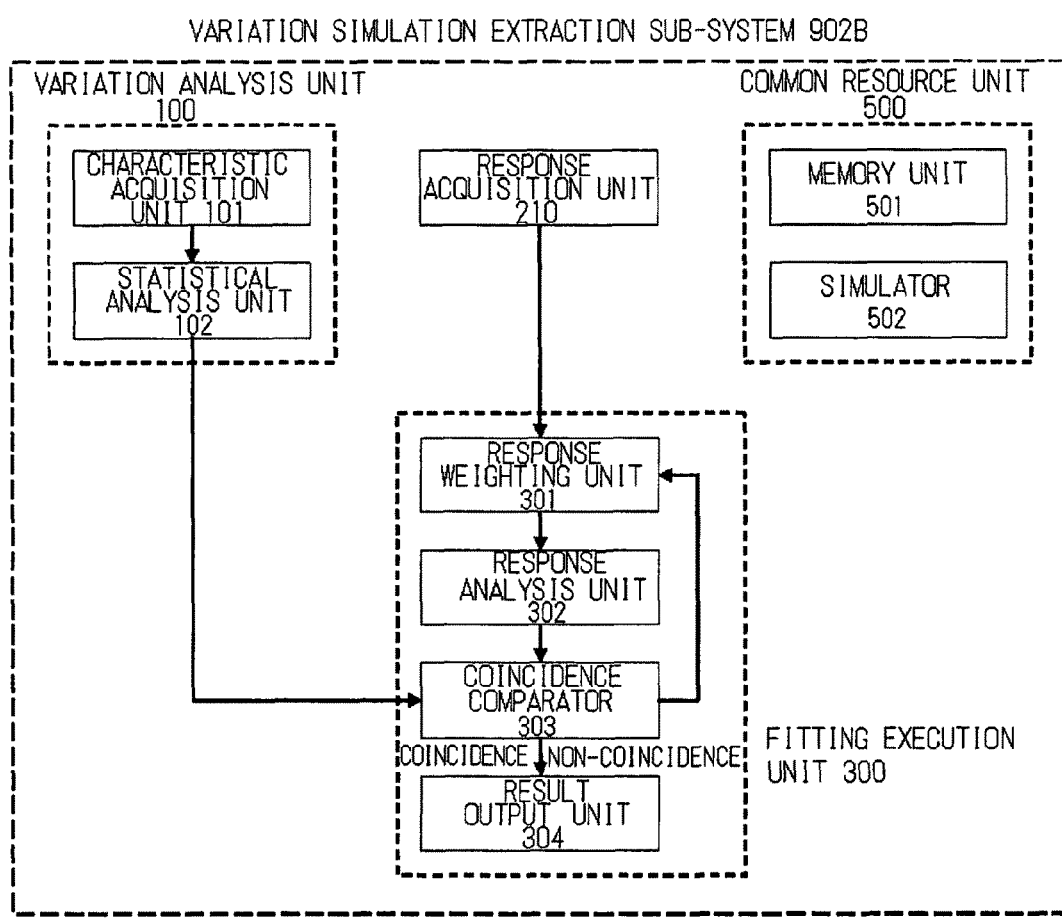
FIG. 13 is a block diagram showing the constitution of a modification of the second embodiment of the present invention.

In the present embodiment, the model analysis unit 200 may also be the response acquisition unit 210, as shown in FIG. 13, as in the first embodiment.

Meanwhile, if it is unnecessary for the response acquisition unit 210 per se to carry out the simulation, the simulator 502 may be dispensed with.

Figure 11:
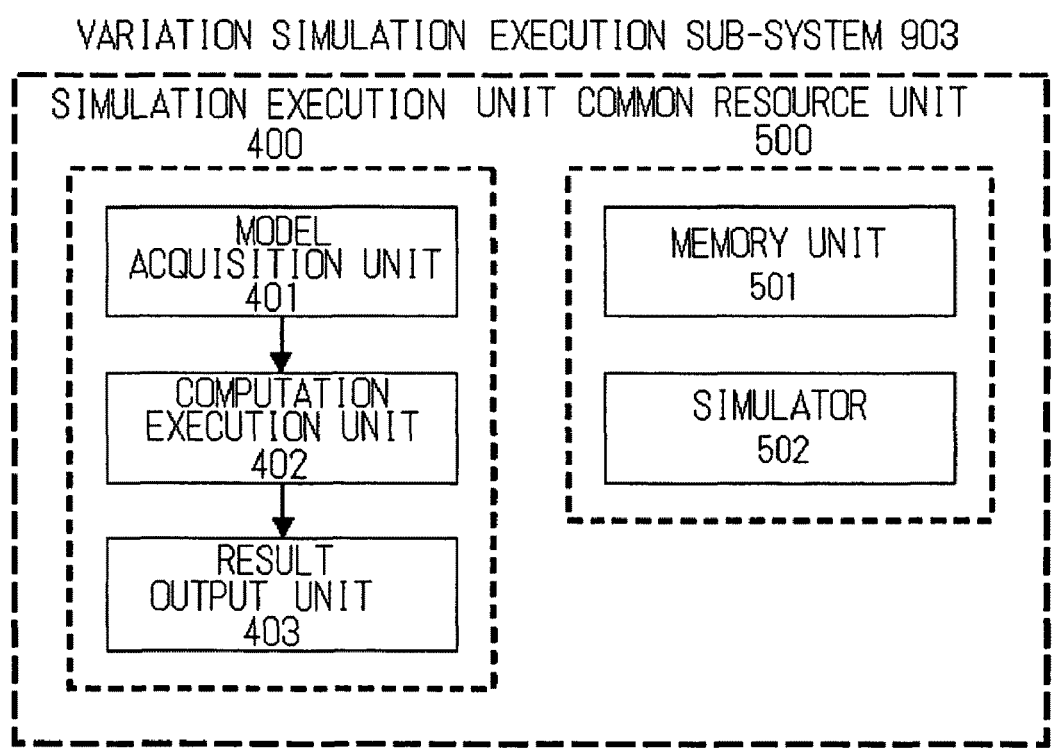
FIG. 11 is a block diagram showing the constitution of a third embodiment of the present invention.

A third embodiment of the present invention will now be described in detail with reference to the drawings. Referring to FIG. 11, the present third embodiment is the variation simulation extraction sub-system 903. This variation simulation extraction sub-system 903 includes the simulation execution unit 400 separated as an independent unit from the above-described first embodiment. In FIG. 11, the components denoted by the same reference numerals are equivalent to the corresponding components of FIG. 1. In the present embodiment, the simulation execution unit 400 is made up of a model acquisition unit 401, a computation execution unit 402 and the aforementioned result output unit 403.

The model acquisition unit 401 acquires a center model and a variation model (cause parameter information and the information on how the cause parameters are varied). However, the model acquisition unit 401 may not have to acquire the models each time provided that part or all of the above information is set in the system beforehand or implicitly included in the system. Alternatively, part or all of the above information may be recorded in the memory unit 501 at the time of initial acquisition, whereby the model acquisition unit 401 may not have to acquire the models each time. The variation model may be set beforehand using the variation simulation extraction sub-system 902 described above in connection with the second embodiment.

In case there are provided a plural number of devices, having different characteristics, in a circuit to be simulated, the model acquisition unit 401 may acquire a plural number of center models or a plural number of variation models.

The computation execution unit 402 appropriately carries out circuit simulation. For example, the computation execution conducts a Monte Carlo experiment, as in the example already explained in connection with the first embodiment.

The result output unit 403 suitably outputs the results of simulation execution.

The meritorious effect of the second and third embodiments of the present invention will now be described.

In the above-described first embodiment, decision of the variation model and execution of the simulation employing it are carried out as one operation. However, these two do not necessarily have to be carried out as one, because it is sufficient that, if once the variation model has become known, the operation of extracting the variation model may be omitted as from that time and the simulation may be carried out using the know variation model. According to the second and third embodiments of the present invention, the operation of variation model extraction and the operation of carrying out the simulation are separated from each other so that these two may be carried out independently of each other. This further improves the efficiency of the fluctuation simulation. Usually, the fluctuation simulation is carried out on plural sorts of circuits. Here, it is only the operation of simulation that needs to be carried out a plural number of times, while it is only sufficient to carry out variation model extraction only once. Moreover, the efficiency may be improved by separating the operation of extraction of a variation model and the operation of simulation.

The foregoing description is directed to an example of application to circuit simulation for circuits inclusive of electronic devices, in particular to an example of application to current-to-voltage characteristics of MOSFETs. However, the technique constituting the basis of the present invention is not limited by the sorts of devices or by the sorts of the device characteristics, and may be applied to arbitrary device characteristics that may be expressed by models.

Hence, the quantities representing the device characteristics may be any of the current, voltage, capacitance, inductance and resistance, or any quantities derived therefrom. For example, the quantities representing the device characteristics may be mutual conductance, obtained by differentiating the current through a drain terminal with the voltage at a gate terminal, or an output resistance, obtained by differentiating the voltage at the drain terminal with the current through the drain terminal, in the case of a MOSFET. The quantities representing the device characteristics may likewise be a common emitter current amplification factor, obtained by dividing the current through a collector terminal with the current through a base terminal, or a base common current amplification factor, obtained by dividing the current through a collector terminal with the current through an emitter terminal, in the case of a bipolar transistor.

The quantities representing the device characteristics may also be complex voltage or complex current, having both the information of the amplitude and the information on the phase of an AC signal, or quantities derived therefrom, such as complex admittance, complex impedance, S-parameter, Y-parameter, Z-parameter or h-parameter.

The quantities representing the device characteristics may further be optical quantities, such as intensity, phase, refractive index, transmittance and reflectance of light, or quantities derived therefrom, in the case of optical devices, such as light emitting diodes or semiconductor laser.

The quantities representing the device characteristics may also be mechanical quantities, such as amounts of displacements or bends, speed of movement or the force of friction, or quantities derived therefrom, in the case of mechanical devices.

The device sorts may also be other sorts of FETs, such as MISFETs, MESFETs or JFETs, in addition to MOSFETs, bipolar transistors, a variety of diodes, inclusive of light emitting diodes, semiconductor laser and solar batteries, or any semiconductor devices, such as thyristors or CCDs. The device sorts may also be any devices, other than semiconductor devices, such as liquid crystal display devices, plasma display devices, field emission display devices, organic light emission display device, vacuum tube amplifying devices, vacuum tube light emitting devices or a variety of devices for MEMS, such as actuators or sensors.

The circuit simulation models the characteristics of electronic devices, as physical phenomenon, by mathematical equations. It will be apparent from the foregoing that the present invention may be applied to the case of modeling an arbitrary phenomenon by a mathematical equation in case the fluctuation of the phenomenon needs to be reproduced by a model, in the same way as the present invention is applied to an electronic device.

The present invention is featured by the fact that there is placed no particular limitations on the model basis for simulation that is employed. According to the present invention, the variation model is determined not by directly employing the detailed inner information of the model basis, but by using the response of the device model to changes in parameters. That is, the model analysis unit 200, invoking and exploiting the simulator 502, is able to accomplish the objective of comprehending the model's response without being concerned about the inner structure of the simulator 502. Hence, according to the present invention, the model basis or the simulator 502 may be replaced freely. A user is able to select a pre-existing model basis, for example, one in popular use as standard in business circles, as appropriate, for combination with the present invention. As a result, there is no necessity of changing pre-existing designing environment or resources, so that it is possible to construct an environment for execution of the fluctuation simulation at low costs. For making the best use of this feature, the variation simulation system according to the present invention may be constructed so that the user may optionally select the model basis which is to be in use. That is, the variation simulation system according to the present invention may be constructed so that the user will be able to exchange the simulator 502, or modify it as necessary, in order to improve system flexibility.

In the foregoing description, it is assumed that the relationship between device model parameters and cause parameters, inclusive of the case that the two kinds of parameters are the same, is to be specified from the outset. It is also possible to extend such technique (basic technique) to determine the relationship between device model parameters and cause parameters, and the manner of variations of the cause parameters, simultaneously. This extended method (extended technique) is effective in cases it is not easy to know the relationship between device model parameters and cause parameters beforehand.

In the standard technique, the manner of variations of cause parameters is determined by fitting so that the variations of characteristic values will be reproduced properly. In the extended technique, both the manner of variations of the cause parameters and the relationship between device model parameters and cause parameters, are determined by fitting so that the variations of characteristic values will be reproduced properly.

The relationship between device model parameters and cause parameters is represented in general as indicated by the equation (7). However, the form of the equation (7) is restricted in order for this relationship to be treated by fitting. It is therefore convenient to use the following linear formula for transformation as a special form of the equation (7):

$$\begin{pmatrix} \Delta p_1 \\ \Delta p_2 \\ \vdots \\ \Delta p_m \end{pmatrix} = G \begin{pmatrix} \Delta P_1 \\ \Delta P_2 \\ \vdots \\ \Delta P_M \end{pmatrix}, G = \begin{pmatrix} g_{11} & g_{12} & \cdots & g_{1M} \\ g_{21} & g_{22} & \cdots & g_{2M} \\ \vdots & \vdots & \ddots & \vdots \\ g_{m1} & g_{m2} & \cdots & g_{mM} \end{pmatrix} \quad (15)$$

where $\Delta P_i$ stands for the displacement from the center value of the i'th cause parameter and $\Delta p_j$ stands for the displacement from the center value of the j'th device model parameter. The respective elements of G are constants. These values and the values of the standard deviation of the cause parameters should be selected so that variations as actually measured will be reproduced.

The cause parameters may be assumed to be uncorrelated with one another. If there is correlation among the cause parameters, it is possible to apply the aforementioned principal component analysis to express the cause parameters as unitary transformation of an equal number of reciprocally uncorrelated parameters. If these uncorrelated parameters are taken as new cause parameters, and the aforementioned unitary transformation matrix, multiplied from the right side of G, is taken as new G, the cause parameters can be transformed to be uncorrelated with one another, without modifying the form of the equation (15). Thus, even if the limitation is imposed that the cause parameters are uncorrelated with one another from the outset, the degree of freedom in the representation by the equation (15) is not reduced.

Also, similarly to the reference response matrix R0, R0' is defined as follows:

$$R_0' = \begin{pmatrix} r'_{11} & \cdots & r'_{1m} \\ \vdots & \ddots & \vdots \\ r'_{n'1} & \cdots & r'_{n'm} \end{pmatrix} \quad (16)$$

Here, r'ij is the displacement of the computed i'th transformed characteristic value yi', in response to a present amount of displacement $\Delta p_j$ in the j-th device model parameter pj, divided by $\Delta p_j$, where i=1, ..., n' and j=1, ..., m. Then, the following relationship is satisfied:

$$R_0 = R_0' G \quad (17)$$

If all the cause parameters are one of the device model parameters, R0' coincides with R0 (in this event, there is no necessity of employing the extended technique).

The extended technique may be realized by following modification of the standard technique.

With the standard technique, the model analysis unit 200 or the response acquisition unit 210 initially determines R0'. With the extended technique, the model analysis unit 200 or the response acquisition unit 210 determines R0' in place of R0. That is, not the response of the model to the cause parameters, but the response of the model to the parameters of the device model, is analyzed (it is noted that the cause parameters may coincide with the device model parameters).

In the standard technique, the response weighting unit 301 sets only trial values of the standard deviation of the cause parameters as appropriate. In addition, in the extended technique, the response weighting unit sets trial values of the elements of the matrix G, as appropriate. That is, R0 is weighted after the elements of the matrix G are also changed for every trial, and the reference response matrix R0 is changed for every trial in accordance with the equation (17). From a different viewpoint, R0' is weighted by the matrix G and σ1, σ2, ..., and σM. The extended technique is the same as the standard technique insofar as the other operations are concerned.

In setting the elements of G, it is preferred to set the constraint that the length of each column vector of G is equal to a constant, preferably 1. The reason is that the response matrix R, given by the equation (9), remains invariable even if the length of the i'th column vector of G is multiplied by a constant A and the value of the corresponding standard deviation σi is multiplied by 1/A. Consequently, the degree of freedom in expressing the variations is not decreased even if limitations are imposed on the length of each column vector of G. On the other hand, the number of dimensions of the space within which to perform optimum value search is decreased to improve the search efficiency.

A trial value of the element of G, satisfying this condition, may be selected as follows: That is, after optionally selecting each element of the i'th column, the length of the i'th column is computed. The element of the i'th column is then normalized by division with the aforementioned length.

In setting the elements of G, it is preferred to provide constraints that the respective column vectors of G are orthogonal one another. If i'th column of G contains a component parallel to j'th column, the response matrix R, given by the equation (9) may be rendered invariable by eliminating the component parallel to the j'th column from the i'th column and by correspondingly adjusting the value of the standard deviation σj associated with the j'th column. Hence, the degree of freedom in expressing the variations is not decreased despite a limitation that the respective column vectors of G are orthogonal one another. On the other hand, the number of dimensions of the space within which to perform optimum value search is decreased by the above constraint, thereby improving the search efficiency.

The trial values of the elements of G satisfying this condition may, for example, be selected as follows: That is, the elements of the first column are arbitrarily selected, and the elements of the second column are then arbitrarily selected under the constraint that first and second columns are orthogonal to each other. This is repeated in a similar manner so that the elements of the i'th column are arbitrarily selected under the constraint that the i'th column is orthogonal to the first to (i−1)st columns. For arbitrarily selecting the elements of the i'th column under the constraint that the i'th column is orthogonal to the first to (i−1)st columns, i'th to n'th elements of the i'th column are first selected arbitrarily. The remaining elements, that is, the first to (i−1)st elements, are taken to be unknown numbers, and the products of the i'th column with the first to (i−1)st columns are set to zero to derive (i−1) simultaneous linear equations.

This simultaneous linear equation is then solved to determine the first to (i−1)st elements. The lengths of the respective columns may be normalized as appropriate.

In the absence of the above constraint, the number of dimensions of the search space necessary for determining G is mM. However, by providing the above constraint, the number of dimensions of the search space may be decreased to $(m-1)+(m-2)+\ldots+(m-M)=(2m-M-1)M/2$.

If, as a special case, m=M, G is preferably made a unitary matrix.

In the above example, the case of limiting the equation (7) to a linear transformation equation has been described. However, the present technique may apparently be valid in a similar manner in cases where non-linear transformation equations are posited and used as appropriate.

Figure 14:
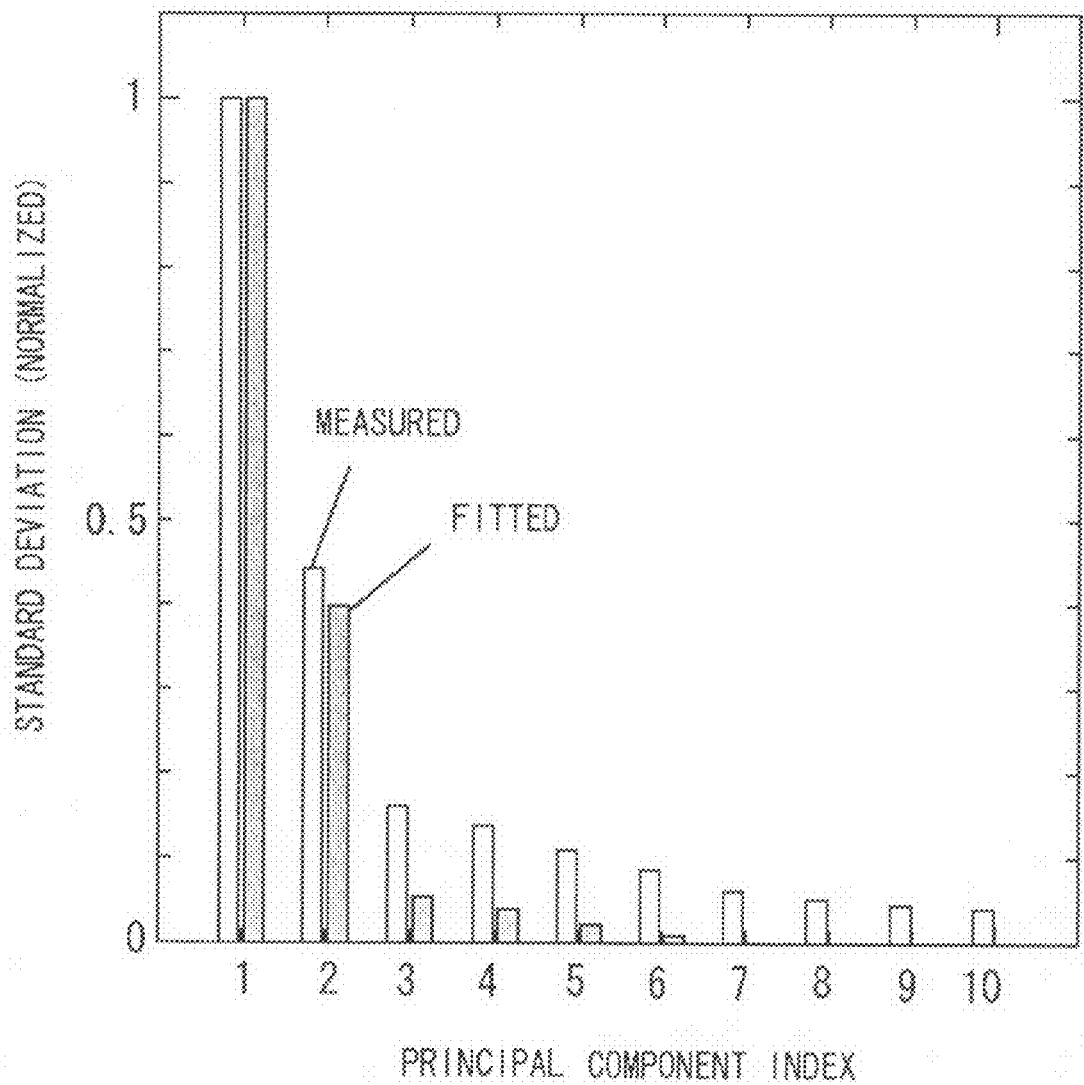
FIG. 14 is a bar graph showing a specified example of the results of reproduction of variations (standard deviation of the principal component) in case the number of cause parameters is increased in the standard technique of the present invention.
Figure 15:
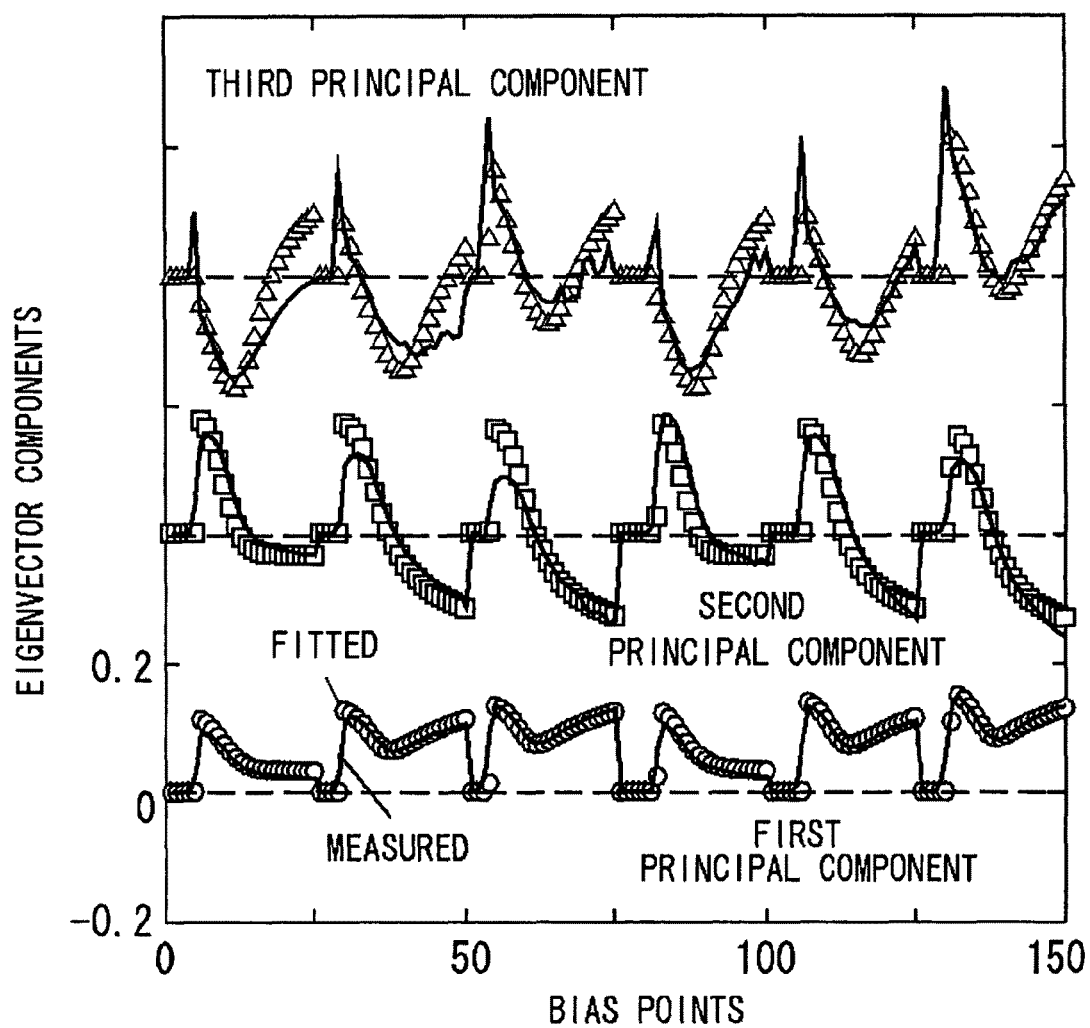
FIG. 15 is a bar graph showing a specified example of the results of reproduction of variations (eigenvector of principal components) in case the number of cause parameters is increased in the standard technique of the present invention.

FIGS. 14 and 15 show the results of reproduction of variations in a case where the number of the cause parameters is increased in the standard technique. That is, W, TOX, VTH, U0 and VSAT are set, in addition to LG and VOFF, as cause parameters. Comparison to FIGS. 5 and 6 reveals that fluctuation reproduction has been improved by increasing the number of parameters. However, the improvement is insufficient the number of parameters is much increased (coincidence of the second and third principal components is unsatisfactory).

Figure 16:
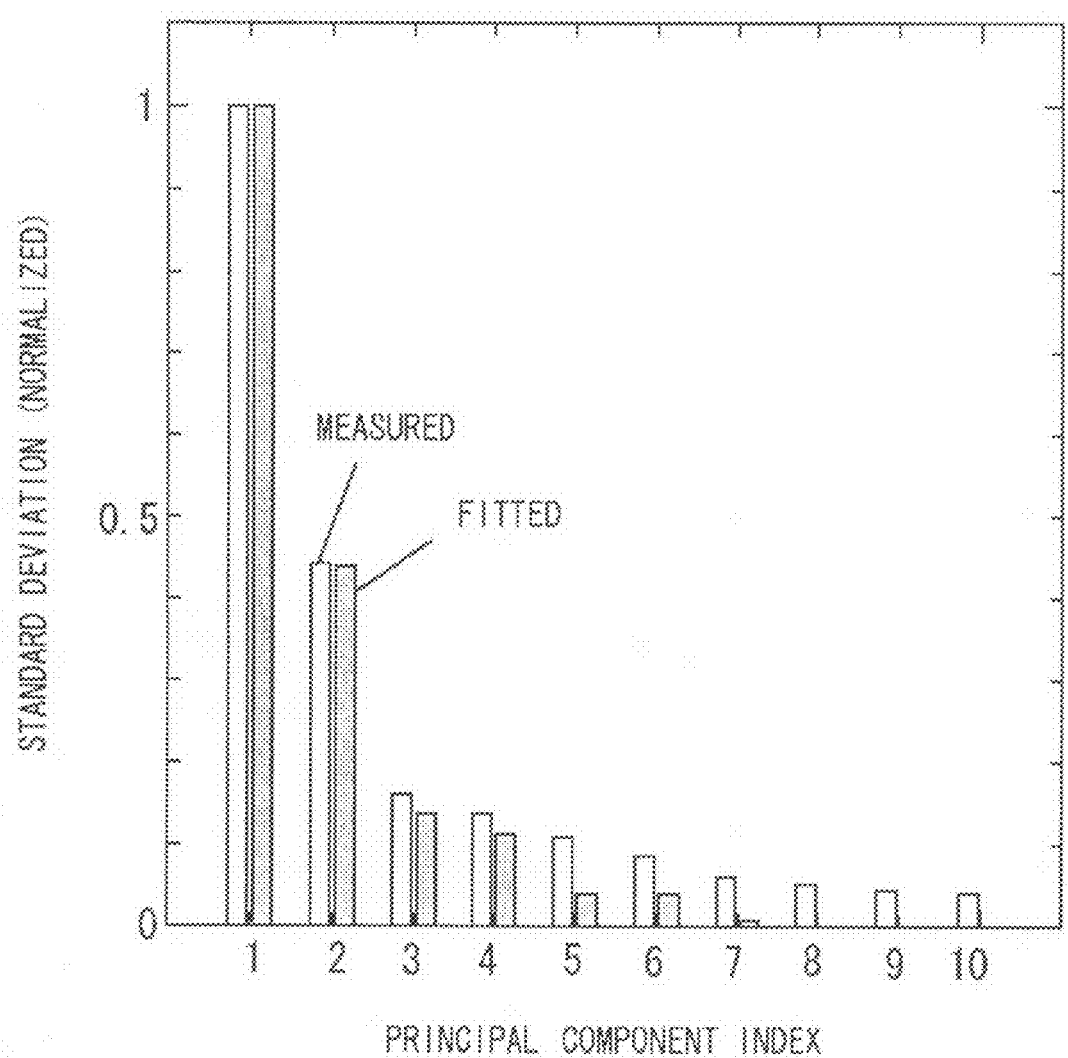
FIG. 16 is a bar graph showing a specified example of the results of reproduction of variations (standard deviation of the principal component) in case the number of cause parameters is increased in an extended technique of the present invention.
Figure 17:
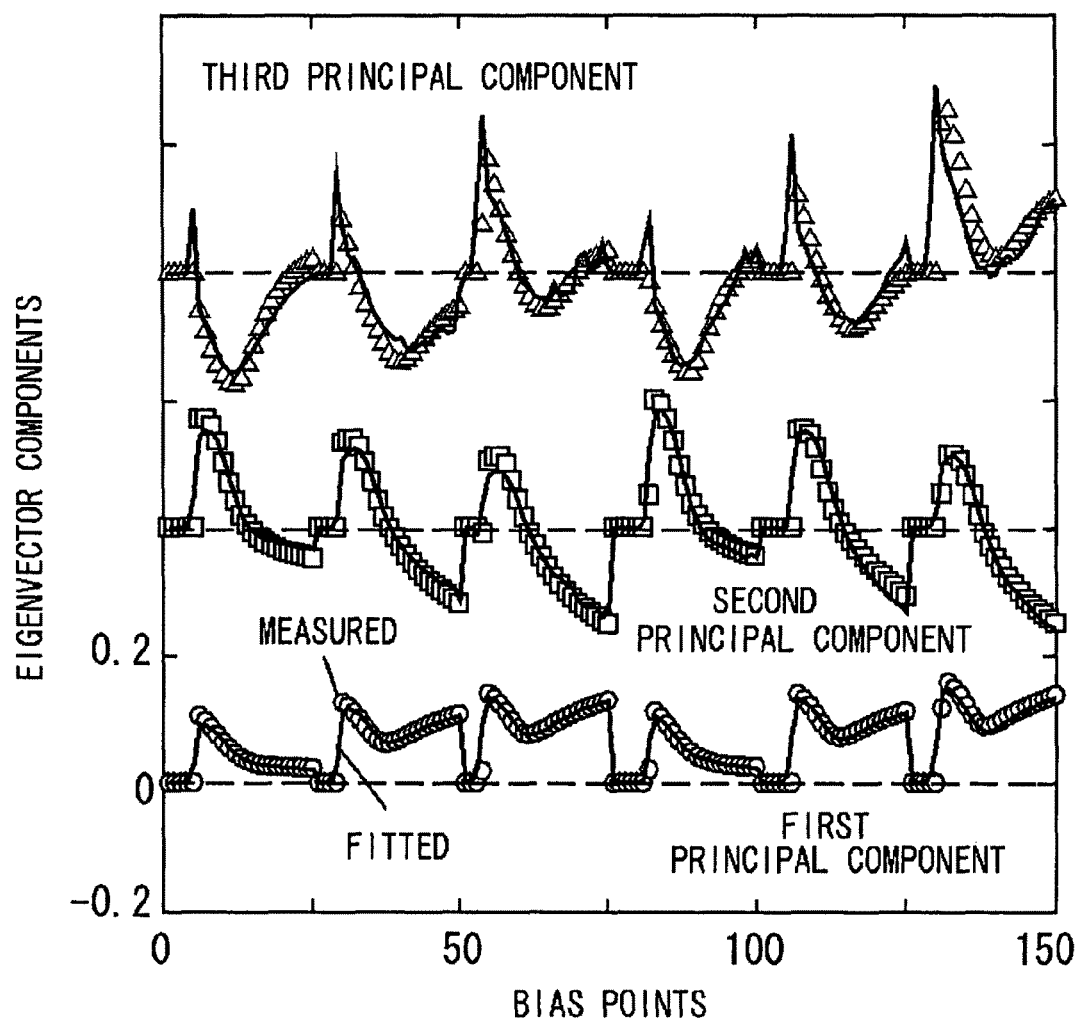
FIG. 17 is a bar graph showing a specified example of the results of reproduction of variations (eigenvector of the principal component) in case the number of cause parameters is increased in an extended technique of the present invention.

FIGS. 16 and 17 show the results for a case where LG, VOFF, TOX, VTH, U0 and VSAT are variable, as in FIGS. 14 and 15, but are not taken to be cause parameters and search for cause parameters is carried out simultaneously by the extended technique.

It is assumed that the relationship between the device model parameters LG, VOFF, TOX, VTH, U0 and VSAT and the cause parameters is given by the equation (15). The fluctuation reproduction has been improved further and optimum coincidence may be noticed up to the third principal component.

Thus, the fluctuation reproduction may be improved in accuracy by selecting the extension technique of the present invention and by automatically selecting the proper cause parameters, even in case there lacks detailed information on the cause parameters.

INDUSTRIAL APPLICABILITY

The present invention may be applied to the designing of circuits employing the electronic devices, especially to the designing of integrated circuits.

In addition, the present invention may be applied to any phenomena modeled by mathematical equation(s), where it is necessary to reproduce the variations in these phenomena by using the model, in the same way as those for electrical devices.

The invention claimed is:

1. A variation simulation system, comprising a computer with a memory storing instructions to execute:
    a characteristic acquisition unit that acquires a characteristic value which reflects a physical phenomenon;
    a statistical analysis unit that extracts a statistical feature of said characteristic value by a principal component analysis;
    a model acquisition unit that acquires a model which simulates said physical phenomenon;
    a response measurement unit that measures a response of the characteristic value simulated when a cause parameter is displaced a preset width;
    a response weighting unit that weights said response to obtain a response matrix;
    a response analysis unit that performs a singular value decomposition of said response matrix; and
    a coincidence comparator that compares the extracted statistical feature of said characteristic value with a result of singular values from said singular value decomposition by the response analysis unit to decide a coincidence/non-coincidence.

2. The variation simulation system according to claim 1, further comprising a simulation execution unit that executes a simulation based on information on weighting which gives rise to said coincidence.

3. A variation simulation system, comprising a computer with a memory storing instructions to execute:
    a variation analysis unit that extracts a statistical property of a characteristic value which reflects a physical phenomenon;
    a model analysis unit that analyzes a response of the characteristic value simulated by a model which simulates said physical phenomenon to a preset parameter; and
    a fitting execution unit that determines a manner of variation of said preset parameter, based on a result of analysis of said response, so that said statistical property will be reproduced by said model,
    wherein said variation analysis unit extracts statistical properties including said statistical property using a principal component analysis on said characteristic value which reflects said physical phenomenon,
    wherein said model analysis unit determines the response of said characteristic value when said preset parameter is displaced a preset width, and
    wherein said fitting execution unit compares a result of singular values from a singular value decomposition of a response matrix obtained by weighting said response to the extracted statistical property to decide a coincidence/non-coincidence.

4. A variation simulation system, comprising a computer with a memory storing instructions to execute:
a characteristic acquisition unit that acquires a characteristic value which reflects a physical phenomenon;
a statistical analysis unit that extracts a statistical feature of said characteristic value by a principal component analysis;
a response acquisition unit that acquires a response of a simulated characteristic value for a preset parameter;
a response weighting unit that weights said response to acquire a response matrix;
a response analysis unit that performs a singular value decomposition of said response matrix; and
a coincidence comparator that compares the extracted statistical feature of said characteristic value with a result of singular values from said singular value decomposition to decide a coincidence/non-coincidence.

5. A variation simulation system, comprising a computer with a memory storing instructions to execute:
a variation analysis unit that extracts a statistical property of a characteristic value which reflects a physical phenomenon;
a model analysis unit that analyzes a response of the characteristic value simulated by a model which simulates said physical phenomenon to a preset parameter;
a fitting execution unit that determines a manner of variation of said preset parameter, based on a result of analysis of said response, so that said statistical property will be reproduced by said model, wherein said fitting execution unit includes a response weighting unit that weights said response to obtain a response matrix;
a response analysis unit that performs a singular value decomposition on said response matrix; and
a coincidence comparator that compares the extracted statistical property of the characteristic value and a result of singular values from said singular value decomposition to decide a coincidence/non-coincidence.

6. The variation simulation system according to claim 5, further comprising a result output unit for outputting a magnitude of variations of said preset parameter.

7. A method for determining a variation model using a computer system, the method comprising:
acquiring a characteristic value reflecting a physical phenomenon;
extracting a statistical feature of said characteristic value by a principal component analysis;
acquiring a model which simulates said physical phenomenon;
measuring a response of said characteristic value simulated when a cause parameter is displaced a preset width;
weighting said response to obtain a response matrix;
performing a singular value decomposition of said response matrix; and
comparing the extracted statistical feature of the characteristic value with a result of singular values from said singular value decomposition to decide a coincidence/non-coincidence.

8. A method for determining a variation model using a computer system, the method comprising:
extracting a statistical property of a characteristic value reflecting a physical phenomenon;
analyzing a response of said characteristic value simulated by a model which simulates said physical phenomenon to a preset parameter; and
determining a manner of variation of said preset parameter, based on a result of analysis of said response, so that said statistical property will be reproduced by said model,
wherein said extracting extracts the statistical property of said characteristic value reflecting said physical phenomenon, using a principal component analysis,
wherein said analyzing determines said response of said characteristic value simulated when said preset parameter is displaced a preset width, and
wherein said determining compares a result of singular values from a singular value decomposition of a response matrix obtained by weighting said response with the extracted statistical property to decide a coincidence/non-coincidence.

9. A method for variation simulation by a computer system, the method comprising:
acquiring a characteristic value reflecting a physical phenomenon;
extracting a statistical feature of said characteristic value by a principal component analysis;
acquiring a model which simulates said physical phenomenon;
measuring a response of a characteristic value simulated when a preset parameter is displaced a preset width;
weighting said response to obtain a response matrix;
performing a singular value decomposition of said response matrix;
comparing the extracted statistical feature of the characteristic value with a result of singular values from said singular value decomposition to decide a coincidence/non-coincidence; and
executing the simulation based on said weighting information which gives rise to coincidence.

10. A method for variation simulation by a computer system, the method comprising:
acquiring a characteristic value reflecting a physical phenomenon;
extracting a statistical feature of said characteristic value by principal component analysis;
acquiring a response of a simulated characteristic value to a preset parameter;
weighting said response to acquire a response matrix;
performing a singular value decomposition of said response matrix; and
comparing the extracted statistical feature of the characteristic value with a result of singular values from said singular value decomposition to decide a coincidence/non-coincidence.

11. The variation simulation method according to claim 10, wherein said preset parameter comprises a cause parameter or a parameter contained in a model which simulates said physical phenomenon.

12. The variation simulation method according to claim 11, wherein said parameter contained in said model and a cause parameter are correlated with each other by a preset mathematical equation.

13. The variation simulation method according to claim 12, wherein said preset mathematical equation correlating said parameter contained in said model simulating said physical phenomenon and a cause parameter comprises a linear transformation equation.

14. A non-transitory storage medium embodying a program of machine-readable instructions for causing a computer to execute:
a processing for acquiring a characteristic value reflecting a physical phenomenon;

a processing for extracting a statistical feature of said characteristic value by a principal component analysis;

a processing for acquiring a model simulating said physical phenomenon;

a processing for measuring a response of said characteristic value simulated when a cause parameter is displaced a preset width;

a processing for weighting said response to acquire a response matrix;

a processing for performing a singular value decomposition of said response matrix; and a processing for comparing the extracted statistical feature of the characteristic value with a result of singular values from said singular value decomposition to decide a coincidence/non-coincidence.

15. A non-transitory storage medium embodying a program of machine-readable instructions for causing a computer to execute:

a first processing for extracting a statistical property of a characteristic value reflecting a physical phenomenon;

a second processing for analyzing a response of said characteristic value simulated by a model which simulates said physical phenomenon to a preset parameter; and a third processing for determining a manner of variation of said preset parameter, based on a result of analysis of said response, so that said statistical property will be reproduced by said model, wherein said program further causes said computer:

to extract statistical properties including said statistical property of said characteristic value reflecting said physical phenomenon, using a principal component analysis, as said first processing to acquire the response of said characteristic value simulated when said preset parameter is displaced a preset width, as said second processing, and to compare a result of singular values from a singular value decomposition of a response matrix obtained by weighting said response with the extracted statistical properties from said principal component analysis to decide a coincidence/non-coincidence.

16. A non-transitory storage medium embodying a program of machine-readable instructions for causing a computer to execute:

a processing of acquiring a characteristic value reflecting a physical phenomenon;

a processing of extracting a statistical feature of said characteristic value by a principal component analysis;

a processing of acquiring a response of a simulated characteristic value to a preset parameter;

a processing of weighting said response to obtain a response matrix;

a processing of acquiring a singular value decomposition of said response matrix; and a processing of comparing the extracted statistical feature of the characteristic value with a result of singular values from said singular value decomposition to decide a coincidence/non-coincidence.

* * * * *